(12) United States Patent
Aramaki et al.

(10) Patent No.: US 12,308,221 B2
(45) Date of Patent: May 20, 2025

(54) SUBSTRATE PROCESSING SYSTEM AND METHOD FOR INSTALLING EDGE RING

(71) Applicant: Tokyo Electron Limited, Tokyo (JP)

(72) Inventors: Takashi Aramaki, Miyagi (JP); Lifu Li, Miyagi (JP); Nobutaka Sasaki, Miyagi (JP); Toshiki Akama, Miyagi (JP); Shusei Kato, Miyagi (JP); Gyeong min Park, Miyagi (JP); Wataru Shimizu, Miyagi (JP); Ryota Koitabashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/925,387

(22) Filed: Oct. 24, 2024

(65) Prior Publication Data

US 2025/0079138 A1    Mar. 6, 2025

Related U.S. Application Data

(63) Continuation of application No. PCT/JP2023/030543, filed on Aug. 24, 2023.

(30) Foreign Application Priority Data

Oct. 7, 2022 (JP) ................. 2022-162521

(51) Int. Cl.
  *H01J 37/32* (2006.01)
(52) U.S. Cl.
  CPC .. *H01J 37/32807* (2013.01); *H01J 37/32642* (2013.01); *H01J 37/32697* (2013.01);
  (Continued)
(58) Field of Classification Search
  None
  See application file for complete search history.

(56) References Cited

U.S. PATENT DOCUMENTS 11,404,282 B2 * 8/2022 Ogasawara ....... H01L 21/31116
11,705,346 B2 * 7/2023 Kuwabara ........... H01L 21/6831
                                                156/345.27
(Continued)

FOREIGN PATENT DOCUMENTS

JP  2001-057363 A  2/2001
JP  2011-009351 A  1/2011
(Continued)

OTHER PUBLICATIONS

International Search Report and Written Opinion mailed on Oct. 17, 2023, received for PCT Application PCT/JP2023/030543, filed on Aug. 24, 2023, 12 pages including English Translation.

*Primary Examiner* — Srinivas Sathiraju
(74) *Attorney, Agent, or Firm* — XSENSUS LLP

(57) ABSTRACT

A substrate processing system includes a plasma processing apparatus, a decompression transferrer coupled to the plasma processing apparatus, and control circuitry that controls a transfer robot to load an edge ring into a process chamber and to transfer the edge ring to a lift assembly, controls the lift assembly to lower the edge ring onto a ring support surface, controls an electrostatic chuck to electrostatically clamp the edge ring onto the ring support surface, and controls a plasma generator to generate plasma in the process chamber and stabilize the electrostatically clamping of the edge ring onto the electrostatic chuck before performing plasma processing on a product substrate, the stabilizing includes controlling a power source to apply pulsed direct current voltage to the substrate support, including applying a first bias voltage and applying a second bias voltage higher than the first bias voltage after applying the first bias voltage.

16 Claims, 10 Drawing Sheets

(52) U.S. Cl.
CPC .. *H01J 37/32715* (2013.01); *H01J 37/32889* (2013.01); *H01J 2237/334* (2013.01)

(56) References Cited

U.S. PATENT DOCUMENTS

| | | | |
|---|---|---|---|
| 2020/0108096 A1* | 4/2020 | Min | C12N 5/0638 |
| 2020/0243298 A1* | 7/2020 | Nishide | H01J 37/32082 |
| 2020/0303203 A1* | 9/2020 | Ogasawara | H01L 21/30655 |
| 2021/0118648 A1* | 4/2021 | Hayashi | H01L 21/68742 |
| 2021/0193477 A1* | 6/2021 | Ishikawa | B05D 1/62 |
| 2021/0202260 A1* | 7/2021 | Ishikawa | H01L 21/02205 |
| 2021/0233777 A1* | 7/2021 | Sasagawa | H01L 21/32139 |
| 2021/0233778 A1* | 7/2021 | Tomura | H01L 21/32055 |
| 2021/0257197 A1* | 8/2021 | Matsuda | G01P 5/00 |
| 2021/0287883 A1* | 9/2021 | Tamamushi | H01L 21/68735 |
| 2021/0305022 A1* | 9/2021 | Tsujimoto | H01J 37/32642 |
| 2021/0313201 A1* | 10/2021 | Kuwabara | H01J 37/32513 |
| 2021/0319988 A1* | 10/2021 | Moyama | H01J 37/32733 |
| 2021/0396506 A1* | 12/2021 | Kubota | G01B 15/02 |
| 2021/0398818 A1* | 12/2021 | Ono | H01L 21/32137 |
| 2022/0122816 A1* | 4/2022 | Sasaki | H01L 21/68742 |
| 2022/0262645 A1* | 8/2022 | Ishikawa | H01L 21/67069 |
| 2023/0178417 A1* | 6/2023 | Matsuura | H01L 21/683 |
| | | | 414/680 |

FOREIGN PATENT DOCUMENTS

| | | |
|---|---|---|
| JP | 2018-010992 A | 1/2018 |
| JP | 2021-141308 A | 9/2021 |
| JP | 2022-111771 A | 8/2022 |
| JP | 2022-148699 A | 10/2022 |

* cited by examiner

SUBSTRATE PROCESSING SYSTEM AND METHOD FOR INSTALLING EDGE RING

CROSS-REFERENCE TO RELATED APPLICATIONS

This application is a Continuation of PCT International Application No. PCT/JP2023/030543, filed on Aug. 24, 2023, which claims priority under 35 U.S.C. § 119(a) to Japanese Application No. JP 2022-162521 filed in Japan on Oct. 7, 2022, the entire contents of each are hereby incorporated by reference into the present application.

FIELD

The disclosure relates to a substrate processing system and a method for installing an edge ring.

BACKGROUND

Patent Literature 1 describes a method for replacing a focus ring placed on a substrate support to surround a substrate. The focus ring is used in a plasma processing apparatus including a process chamber in which plasma processing is performed on the substrate placed on the substrate support in the internal space of the process chamber. The replacing method includes unloading the focus ring from the process chamber with a transferrer that transfers the focus ring without exposing the process chamber to the atmosphere, and cleaning a surface of the substrate support on which the focus ring is placed after the unloading. The replacing method further includes, after the cleaning, loading a focus ring into the chamber and placing the focus ring onto the substrate support with the transferrer, without exposing the process chamber to the atmosphere. The method described in Patent Literature 1 also includes eliminating static electricity before unloading the focus ring when the focus ring is electrostatically clamped by an electrostatic chuck (ESC) on the substrate support.

CITATION LIST

Patent Literature

Patent Literature 1: Japanese Unexamined Patent Application Publication No. 2018-10992.

BRIEF SUMMARY

Technical Problem

One or more aspects of the disclosure are directed to a technique for electrostatically clamping an edge ring appropriately onto a substrate support when the edge ring is replaced using a transferrer.

Solution To Problem

A substrate processing system according to one aspect of the disclosure includes a plasma processing apparatus, a decompression transferrer coupled to the plasma processing apparatus, and a controller. The plasma processing apparatus includes a process chamber being decompressible, a substrate support located in the process chamber, including a substrate support surface, a ring support surface on which an edge ring is placeable to surround a substrate, and an electrostatic chuck that electrostatically clamps the edge ring onto the ring support surface, and coupled to a power source that provides a pulsed direct current voltage for biasing, a lift assembly that raises and lowers the edge ring, and a plasma generator that generates plasma in the process chamber. The decompression transferrer includes a transfer robot that transfers the edge ring. The controller controls operations including lowering, with the lift assembly, the edge ring loaded into the process chamber and transferred to the lift assembly by the transfer robot and placing the edge ring onto the ring support surface, electrostatically clamping, onto the ring support surface, the placed edge ring, and generating plasma in the process chamber and stabilizing the electrostatically clamping the edge ring onto the electrostatic chuck before performing plasma processing on a product substrate. The stabilizing includes applying, to the substrate support, the pulsed direct current voltage for biasing. The applying the pulsed direct current voltage includes applying a first bias voltage and applying a second bias voltage higher than the first bias voltage after applying the first bias voltage.

Advantageous Effects

The technique according to the above aspect of the disclosure allows an edge ring replaced using the transferrer to be electrostatically clamped onto the substrate support appropriately.

DETAILED DESCRIPTION

Figure 1:
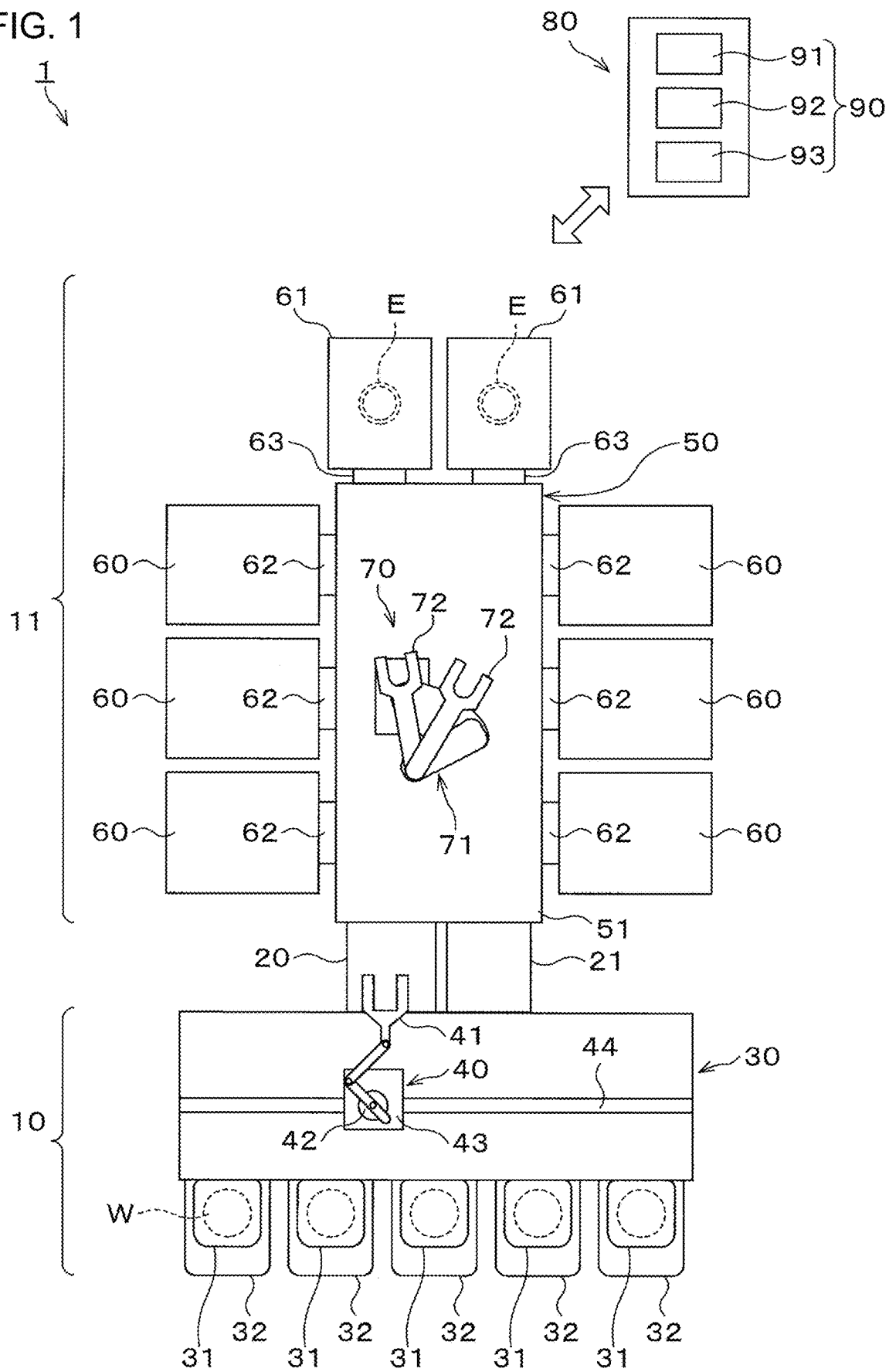
FIG. 1 is a schematic plan view of a plasma processing system as a substrate processing system according to an embodiment.

In the manufacturing process for semiconductor devices or other devices, substrate processing, or specifically, plasma processing such as etching is performed on substrates including semiconductor wafers (hereafter referred to as wafers) using plasma. Plasma processing is performed on a substrate placed on a substrate support in a decompressed process chamber.

For intended and uniform plasma processing results in a central portion and a peripheral portion of the substrate, an annular member in a plan view, which is referred to as a focus ring or an edge ring (hereafter referred to as an edge ring), may be placed on the substrate support to surround the substrate on the substrate support.

The results of plasma processing depend on the temperature of the substrate. The temperature of the substrate support is adjusted during plasma processing, thus allowing the temperature of the substrate to be adjusted through the substrate support.

When the edge ring described above is used, the temperature of the edge ring also affects the results of plasma processing in the peripheral portion of the substrate. The temperature of the edge ring is thus also to be adjusted. The temperature of the edge ring is also adjusted through the substrate support.

However, simply placing the substrate and the edge ring onto the substrate support may cause a vacuum insulation layer to form between the substrate support and the substrate and between the substrate support and the edge ring. The vacuum insulation layer may not allow appropriate temperature adjustment through the substrate support. In response to the above, an electrostatic chuck (ESC) is included in the substrate support to electrostatically clamp the substrate and the edge ring onto the ESC.

The edge ring wears when exposed to and etched by plasma, and is thus to be replaced. The process chamber is typically exposed to the atmosphere to allow an operator to replace such a worn edge ring. The edge ring may also be replaced using a transferrer for transferring an edge ring, without exposing the process chamber to the atmosphere (refer to Patent Literature 1).

When the edge ring is used, simply clamping the edge ring electrostatically onto the ESC may generate an insufficient electrostatic clamping force. This may not allow appropriate temperature adjustment of the edge ring through the substrate support (more specifically, through the ESC).

One or more embodiments of the disclosure are thus directed to a technique for electrostatically clamping an edge ring appropriately onto the substrate support when the edge ring is replaced using the transferrer.

A substrate processing system and a method for installing an edge ring according to the present embodiment will now be described with reference to the drawings. Like reference numerals denote components having substantially the same functions herein and in the drawings. Such components will not be described repeatedly.

Plasma Processing System

FIG. 1 is a schematic plan view of a plasma processing system as the substrate processing system according to the present embodiment.

A plasma processing system 1 in FIG. 1 processes a wafer W as a substrate, or more specifically, performs substrate processing or plasma processing such as etching on the wafer W using plasma.

The plasma processing system 1 includes an atmospheric unit 10 and a decompressor 11, which are integrally connected to each other through loadlock modules 20 and 21. The atmospheric unit 10 includes an atmospheric module in which intended processing is performed on the wafer W in an ambient atmosphere. The decompressor 11 includes decompression modules in each of which intended processing is performed on the wafer W in a decompressed atmosphere (vacuum atmosphere).

The loadlock modules 20 and 21 connect a loader module 30 included in the atmospheric unit 10 and a transfer module 50 included in the decompressor 11 with a gate valve (not shown). The loadlock modules 20 and 21 temporarily hold the wafer W. The loadlock modules 20 and 21 can switch their internal spaces between the ambient atmosphere and the decompressed atmosphere.

The atmospheric unit 10 includes the loader module 30 including a transferrer 40 (described later) and load ports 32 on which front-opening unified pods (FOUPs) 31 are placed. Each FOUP 31 can store multiple wafers W. The loader module 30 may be connected to an orienter module (not shown) that adjusts the horizontal orientation of a wafer W and a buffer module (not shown) that temporarily stores multiple wafers W.

The loader module 30 includes a rectangular housing, with its internal space maintained in an ambient atmosphere. The multiple load ports 32, for example, five load ports 32, are aligned on one side surface, which is a long side of the housing of the loader module 30. The loadlock modules 20 and 21 are aligned on the other side surface, which is another long side of the housing of the loader module 30.

The transferrer 40 for holding and transferring the wafer W is located in the housing of the loader module 30. The transferrer 40 includes a transfer arm 41 that supports the wafer W during transfer, a rotary stand 42 supporting the transfer arm 41 in a rotatable manner, and a base 43 receiving the rotary stand 42. The loader module 30 includes a guide rail 44 extending in the longitudinal direction of the loader module 30. The base 43 is located on the guide rail 44, along which the transferrer 40 is movable.

The decompressor 11 includes the transfer module 50 as a decompression transferrer, processing modules 60 as plasma processing apparatuses, and storage modules 61 as storages. The internal spaces of the transfer module 50 and the processing modules 60 (more specifically, the internal spaces of a decompressed transfer chamber 51 and a chamber 100 described later) are each maintained in a decompressed atmosphere, and the internal spaces of the storage modules 61 are also each maintained in a decompressed atmosphere. The single transfer module 50 receives multiple (e.g., six) processing modules 60 and multiple (e.g., two) storage modules 61. The number of processing modules 60 and their arrangement are not limited to those in the present embodiment and may be set as appropriate. The decompressor 11 may include at least one processing module including a wafer support (described later). The number of storage modules 61 and their arrangement are also not limited to those described in the present embodiment and may be selected as appropriate. The decompressor 11 may include, for example, at least one storage module 61.

The transfer module 50 transfers a wafer W in its internal space. The transfer module 50 also transfers an edge ring E (described later) in its internal space.

The transfer module 50 includes the decompressed transfer chamber 51 defined by a polygonal (quadrangular in a plan view in the illustrated example) housing in a plan view. The decompressed transfer chamber 51 is connected to the loadlock modules 20 and 21.

The transfer module 50 transfers a wafer W loaded into the loadlock module 20 to one processing module 60, and transfers a wafer W on which intended plasma processing has been performed in the processing module 60 to the loadlock module 21.

The transfer module 50 may transfer an edge ring E in one storage module 61 to one processing module 60, and may transfer an edge ring E in the processing module 60 to the storage module 61.

The processing module 60 performs intended plasma processing, such as etching, on the wafer W transferred from the transfer module 50. The processing module 60 is connected to the transfer module 50 with a gate valve 62. The structure of the processing module 60 will be described later in detail.

The storage module 61 stores the edge ring E in a decompressed atmosphere. The edge ring E can be stored in a decompressed atmosphere to remove moisture on the edge ring E during storage. The storage module 61 may include a heater (not shown) to facilitate removal of moisture from the edge ring E in the storage module 61.

The storage module 61 is connected to the transfer module 50 with a gate valve 63.

A transfer robot 70 is located in the internal space of the decompressed transfer chamber 51 in the transfer module 50. The transfer robot 70 can hold and transfer a wafer W. The transfer robot 70 can also hold and transfer an edge ring E.

The transfer robot 70 includes a transfer arm 71 that can turn, extend, and be raised or lowered while holding the wafer W. The transfer arm 71 has its distal end split into two forks 72 as holders. One fork 72 can hold the wafer W to be transferred and the other fork 72 can hold the edge ring E to be transferred.

In the transfer module 50, the transfer arm 71 receives a wafer W held in the loadlock module 20 and loads the wafer W into the processing module 60. The transfer arm 71 receives a wafer W on which intended processing has been performed in the processing module 60 and transfers the wafer W to the loadlock module 21.

In the transfer module 50, the transfer arm 71 may receive an edge ring E in the storage module 61 and loads the edge ring E into the processing module 60. In the transfer module 50, the transfer arm 71 may receive an edge ring E in the processing module 60 and transfer the edge ring E to the storage module 61.

The plasma processing system 1 further includes a controller 80 (i.e., control circuitry). In one embodiment, the controller 80 processes computer-executable instructions that cause the plasma processing system 1 to perform various steps described in one or more embodiments of the disclosure. The controller 80 may control the other components of the plasma processing system 1 to cause the plasma processing system 1 to perform various steps described herein. In one embodiment, some or all of the components of the controller 80 may be included in the other components of the plasma processing system 1. The controller 80 may include, for example, a computer 90. The computer 90 may include, for example, a processor (central processing unit or CPU) 91, a storage 92, and a communication interface 93. The processor 91 may perform various control operations and computations based on programs stored in the storage 92. The storage 92 may include a random-access memory (RAM), a read-only memory (ROM), a hard disk drive (HDD), a solid-state drive (SSD), or a combination of these. The communication interface 93 may communicate with the other components of the plasma processing system 1 through a communication line such as a local area network (LAN).

Wafer Processing with Plasma Processing System 1

An example of wafer processing performed by the plasma processing system 1 with the above structure will now be described.

First, a wafer W is removed from an intended FOUP 31 with the transferrer 40 and loaded into the loadlock module 20. The loadlock module 20 is then hermetically sealed and decompressed. The internal space of the loadlock module 20 is then connected with the internal space of the transfer module 50.

The wafer W is then held by the transfer robot 70 and transferred from the loadlock module 20 to the transfer module 50.

The gate valve 62 corresponding to an intended processing module 60 is then open, and the transfer robot 70 loads the wafer W into the intended processing module 60. The gate valve 62 is then closed, and intended processing is performed on the wafer W in the processing module 60. The processing performed on the wafer W in the processing module 60 will be described later.

The gate valve 62 is then open, and the transfer robot 70 unloads the wafer W from the processing module 60. The gate valve 62 is then closed.

The transfer robot 70 then loads the wafer W into the loadlock module 21. In response to the wafer W being loaded into the loadlock module 21, the loadlock module 21 is hermetically sealed and exposed to the atmosphere. The internal space of the loadlock module 21 is then connected with the internal space of the loader module 30.

The wafer W is held by the transferrer 40 and returned from the loadlock module 21 through the loader module 30 to an intended FOUP 31 for storage. This ends the wafer processing performed by the plasma processing system 1.

Processing Module 60

Figure 2:
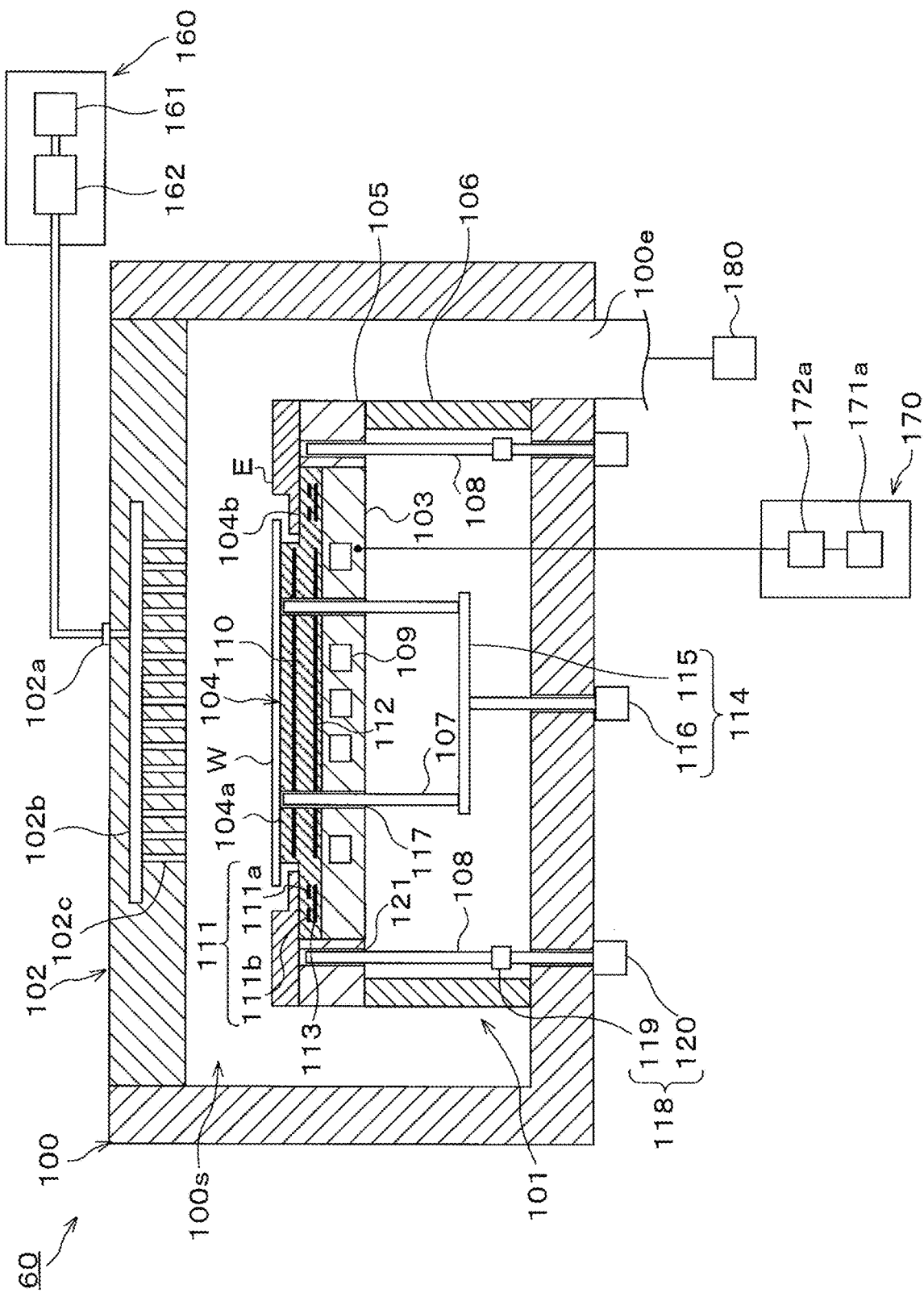
FIG. 2 is a schematic sectional view of a processing module.
Figure 3:
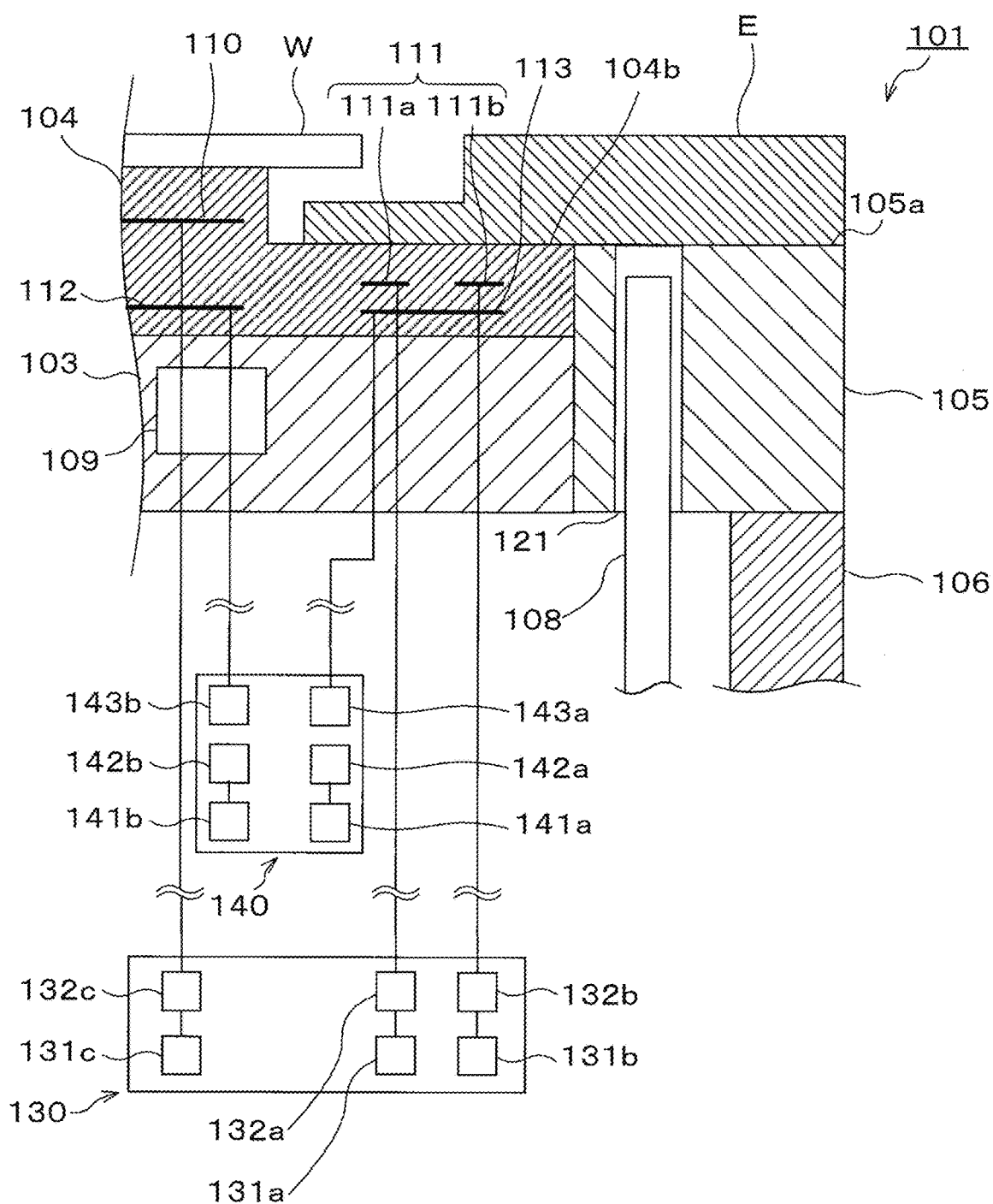
FIG. 3 is a partially enlarged view of the processing module in FIG. 2.
Figure 4:
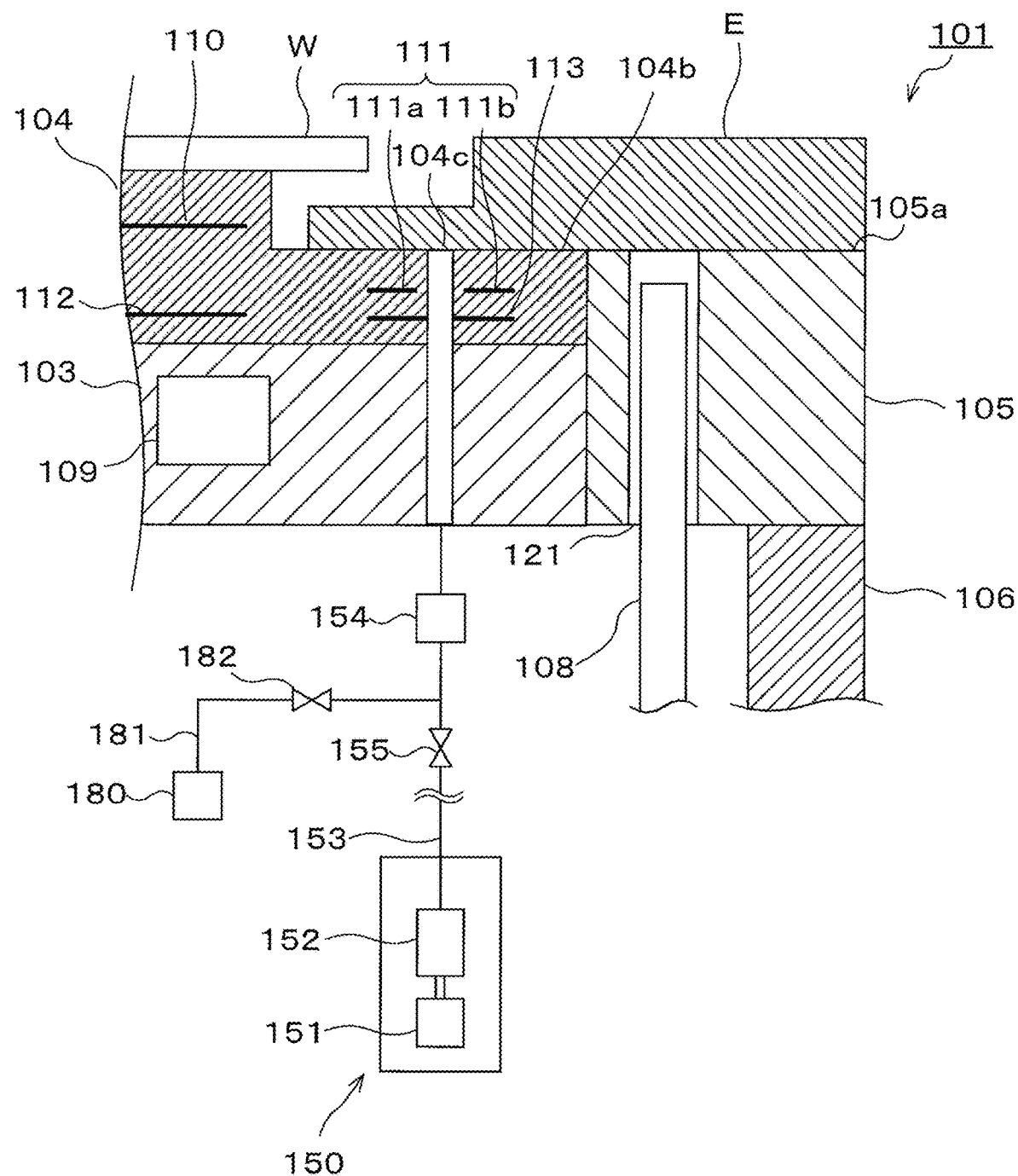
FIG. 4 is an enlarged sectional view of a portion of a wafer support in the circumferential direction different from the portion in FIG. 3.

The processing module 60 will now be described with reference to FIGS. 2 to 4. FIG. 2 is a schematic sectional view of the processing module 60. FIG. 3 is a partially enlarged view of the processing module 60 in FIG. 2. FIG. 4 is an enlarged sectional view of a portion of the wafer support 101 (described later) in the circumferential direction different from the portion in FIG. 3.

As shown in FIG. 2, the processing module 60 includes the chamber 100 as a process chamber, a gas supply 160, a radio-frequency (RF) power supply 170, and an exhaust system 180. The processing module 60 also includes a voltage application unit 130 (refer to FIG. 3), a bias unit 140 (refer to FIG. 3), and a gas supply 150 (refer to FIG. 4). The processing module 60 further includes the wafer support 101 as a substrate support and an upper electrode 102.

The chamber 100 has a decompressible internal space defining a process space 100s in which plasma is generated. The chamber 100 accommodates, for example, the wafer support 101 in the internal space. The chamber 100 may be formed from, for example, aluminum. The chamber 100 is coupled to a ground potential.

The wafer support 101 is located in, for example, a lower portion of the chamber 100. The upper electrode 102 is located above the wafer support 101, and may define a part of the ceiling of the chamber 100.

The wafer support 101 supports the wafer W. In one embodiment, the wafer support 101 includes a lower electrode 103, an ESC 104, a support 105, an insulator 106, lifters 107, and lifters 108. The wafer support 101 also supports the edge ring E. The wafer support 101 may or may not include the edge ring E as its component.

The lower electrode 103 is formed from, for example, a conductive material such as aluminum. In one embodiment, a channel 109 for a temperature adjusting fluid is located inside the lower electrode 103. The channel 109 receives the temperature adjusting fluid from a chiller unit (not shown) external to the chamber 100. The temperature adjusting fluid supplied to the channel 109 returns to the chiller unit. For example, the wafer support 101 (specifically, the ESC 104), the wafer W, or the edge ring E can be cooled to a predetermined temperature with low-temperature brine as the temperature adjusting fluid circulating through the channel 109. For example, the wafer support 101 (specifically, the ESC 104), the wafer W, or the edge ring E can be heated to a predetermined temperature with high-temperature brine as a temperature adjusting fluid circulating through the channel 109. The channel 109 may at least partially serve as a cooler for cooling the edge ring E.

For the wafer support 101 including a temperature adjuster, the temperature adjuster is not limited to the channel 109 described above, and may be in another form, such as a resistance heater. The wafer support 101 may include a temperature adjuster on a member other than the lower electrode 103.

The ESC 104 electrostatically clamps at least the edge ring E. The ESC 104 is located on the lower electrode 103. The ESC 104 may also electrostatically clamp the wafer W. In one embodiment, the ESC 104 has a central portion serving as a substrate support portion. In one embodiment, the ESC 104 has a central upper surface at a higher position than a peripheral upper surface. In one embodiment, the ESC 104 has a central upper surface 104a on which the wafer W is placeable and a peripheral upper surface 104b on which the edge ring E is placeable. More specifically, in one embodiment, the ESC 104 has the central upper surface 104a as a wafer support surface or a substrate support surface on which the wafer W is placeable and the peripheral upper surface 104b as a ring support surface on which the edge ring E is placeable to surround the substrate support surface.

The edge ring E surrounds the wafer W, or more specifically, surrounds the wafer W placed on the ESC 104. In one embodiment, the edge ring E is placed on the ESC 104 to surround the central portion with the upper surface at a higher position than the upper surface of the peripheral portion of the ESC 104. The edge ring E is annular in a plan view. The edge ring E is formed from, for example, Si or $SiO_2$.

The ESC 104 may include, in the central portion, an electrode 110 for electrostatically clamping the wafer W onto the central upper surface 104a. The ESC 104 includes, in the peripheral portion, an electrode 111 for electrostatically clamping the edge ring E onto the peripheral upper surface 104b. The electrode 111 is, for example, a bipolar electrode including a pair of electrodes 111a and 111b at different positions. The electrode 111a is closer to the central portion of the ESC 104, or located inward. The electrode 111b is located outward.

The ESC 104 may include, in the central portion, an electrode 112 that receives a bias for drawing, for example, ions from plasma generated in the chamber 100 toward the wafer W. The ESC 104 includes, in the peripheral portion, an electrode 113 that receives a bias for drawing, for example, ions from plasma generated in the chamber 100 toward the edge ring E. In one embodiment, the electrode 110 is located above the electrode 112, and the electrode 111 is located above the electrode 113.

The ESC 104 includes an insulator formed from an insulating material. The electrodes 110, 111, 112, and 113 are, for example, embedded in the insulator.

As shown in FIG. 3, the electrode 111 is coupled to the voltage application unit 130 to generate an electrical force (specifically, for example, a Coulomb force) for electrostatically clamping the edge ring E. For the electrode 111 being a bipolar electrode, the voltage application unit 130 selectively applies a voltage with different polarities or a voltage with the same polarity to the electrodes 111a and 111b in the pair.

The voltage application unit 130 includes, for example, two direct current (DC) power sources 131a and 131b and two switches 132a and 132b.

The DC power source 131a is coupled to the electrode 111a through the switch 132a to selectively apply a positive voltage or a negative voltage to the electrode 111a to electrostatically clamp the edge ring E.

The DC power source 131b is coupled to the electrode 111b through the switch 132b to selectively apply a positive voltage or a negative voltage to the electrode 111b to electrostatically clamp the edge ring E.

The voltage application unit 130 may include a DC power source 131c and a switch 132c.

The DC power source 131c is coupled to the electrode 110 through the switch 132c to apply a voltage to the electrode 110 to electrostatically clamp the wafer W.

The bias unit 140 is coupled to the electrode 113.

The bias unit 140 includes, for example, a bias power source 141a, a matching circuit 142a, and a filter 143a.

The bias power source 141a is coupled to the electrode 113 through the matching circuit 142a and the filter 143a to apply a pulsed DC voltage for biasing, or a pulsed bias DC voltage, to the electrode 113 to draw, for example, ions from plasma generated in the chamber 100 toward the edge ring E. More specifically, the bias power source 141a applies a pulsed negative DC voltage. The bias power source 141a can switch between continuous application and intermittent (specifically, intermittent and periodic) application of the pulsed DC voltage. The bias power source 141a may apply the pulsed DC voltage with a rectangular wave pulse or a square wave pulse. The bias power source 141a can adjust the duty ratio for the intermittent application. The duty ratio herein refers to the ratio of the period in which the pulsed bias DC voltage is applied to the total period in a cycle.

The bias unit 140 may include a bias power source 141b, a matching circuit 142b, and a filter 143b.

The bias power source 141b is coupled to the electrode 112 through the matching circuit 142b and the filter 143b to apply a pulsed bias DC voltage to the electrode 112 to draw, for example, ions from plasma generated in the chamber 100 toward the wafer W. The bias power source 141b may not apply a pulsed bias DC voltage to the electrode 112, but may provide, for example, RF power for biasing, or bias RF power, to the electrode 112. The bias power source, the matching circuit, and the filter may be commonly used by the electrodes 112 and 113.

In the present embodiment, the ESC 104 has the central portion in which the electrode 110 is located and the peripheral portion in which the electrode 111 is located as an integral unit. In some embodiments, the central portion and the peripheral portion may be separate from each other.

In the present embodiment, the electrode 111 for clamping and holding the edge ring E is a bipolar electrode. In some embodiments, the electrode 111 may be a unipolar electrode.

In the present embodiment, a bias for the wafer is provided to the electrode 112, and a bias for the edge ring E is provided to the electrode 113. In other words, the biases are provided to the ESC 104. In some embodiments, a bias may be provided to the lower electrode 103. In this case, a bias for the wafer is the same as a bias for the edge ring E, and the electrodes 112 and 113 are eliminated.

The ESC 104 has the central portion with, for example, a smaller diameter than the wafer W. The wafer W placed on the central upper surface 104a of the ESC 104 thus has its peripheral portion protruding from the central portion of the ESC 104.

The edge ring E has a step on its upper portion, and has the upper surface of its outer peripheral portion at a higher position than the upper surface of its inner peripheral portion. The inner peripheral portion of the edge ring E is located under the peripheral portion of the wafer W protruding from the central portion of the ESC 104. In other words, the edge ring E has its inner diameter smaller than the outer diameter of the wafer W.

The support 105 is an annular member in a plan view, and is formed from an insulating material such as quartz. The support 105 surrounds the lower electrode 103 and the ESC 104.

The ESC 104 may have a gas outlet hole (not shown) in the central upper surface 104a to allow the heat transfer gas to be ejected into a space between the back surface of the wafer W placed and the upper surface 104a. The heat transfer gas from a gas supply (not shown) is supplied through the gas outlet hole. The gas supply may include one or more gas sources and one or more pressure controllers. In one embodiment, the gas supply supplies, for example, the heat transfer gas from the gas source(s) to the gas outlet hole with the pressure controller(s).

As shown in FIG. 4, the ESC 104 has a gas outlet hole 104c in the peripheral upper surface 104b. More specifically, the gas outlet hole 104c has its one end that is open in the peripheral upper surface 104b of the ESC 104. The gas outlet hole 104c supplies the heat transfer gas such as a helium gas into a space between the back surface of the edge ring E on the peripheral upper surface 104b of the ESC 104 and the peripheral upper surface 104b. The end of the gas outlet hole 104c opposite to the peripheral upper surface 104b is connected to the gas supply 150 through a pipe 153. The gas supply 150 may include one or more gas sources 151 and one or more flow controllers 152. In one embodiment, the gas supply 150 supplies, for example, the heat transfer gas from the gas source(s) 151 to the gas outlet hole 104c with the flow controller(s) 152. Each flow controller 152 may include, for example, a mass flow controller or a pressure-based flow controller. The gas outlet hole 104c and the pipe 153 may define at least a part of a supply channel for supplying a gas into the space between the peripheral upper surface 104b of the ESC 104, or the ring support surface, and the back surface of the edge ring E.

The end of the gas outlet hole 104c opposite to the peripheral upper surface 104b is connected to the exhaust system 180 through a pipe 181. This allows the gas around the peripheral upper surface 104b of the ESC 104 to be evacuated through the gas outlet hole 104c. In other words, the gas outlet hole 104c can serve as an exhaust hole to evacuate the gas around the ring support surface including the peripheral upper surface 104b of the ESC 104. Thus, in one embodiment, the gas outlet hole 104c and the pipe 181 may define at least a part of an exhaust channel that evacuates the gas in the space between the peripheral upper surface 104b, or the ring support surface, of the ESC 104 and the back surface of the edge ring E.

The pipe 153 may include a switch valve 155 for switching on and off the supply of the heat transfer gas with the gas supply 150. Similarly, the pipe 181 may include a switch valve 182 for switching on and off the evacuation of the gas around the peripheral upper surface 104b with the exhaust system 180.

The insulator 106 in FIG. 2 is a cylindrical member formed from, for example, a ceramic material. The insulator 106 supports the support 105. The insulator 106 has, for example, the same outer diameter as the support 105 to support the peripheral portion of the support 105.

Each lifter 107 is raised and lowered relative to the central upper surface 104a of the ESC 104. The lifter 107 is, for example, columnar and formed from a ceramic material. When the lifter 107 is raised, its upper end protrudes from the central upper surface 104a to support the wafer W. The lifters 107 allow transfer of the wafer W between the wafer support 101 and the transfer arm 71 in the transfer robot 70.

Three or more lifters 107 are arranged at intervals. Each lifter 107 extends vertically.

Each lifter 107 is raised or lowered by an actuator 114. The actuator 114 includes, for example, a support member 115 supporting the multiple lifters 107 and a driver 116 that generates a driving force for raising and lowering the support member 115 to raise and lower the lifters 107. The driver 116 includes, for example, a motor (not shown) as a drive source to generate the above driving force.

The lifter 107 is placed through an insertion hole 117 having its upper end that is open in the central upper surface 104a of the ESC 104. Each insertion hole 117 extends, for example, downward from the central upper surface 104a of the ESC 104 to the bottom surface of the lower electrode 103.

Each lifter 108 is raised and lowered relative to the peripheral upper surface 104b of the ESC 104. The lifter 108 is, for example, columnar and formed from a ceramic material. In one embodiment, each lifter 108 has its upper end protruding from an upper surface 105a of the support 105 when lifted.

Three or more lifters 108 are arranged at intervals in the circumferential direction of the ESC 104. Each lifter 108 extends vertically.

Each lifter 108 is raised or lowered by an actuator 118. The actuator 118 is, for example, provided for each lifter 108. The lifter 108 includes a support member 119 supporting the lifter 108 in a horizontally movable manner. The support member 119 includes, for example, a thrust bearing to support the lifter 108 in a horizontally movable manner. The actuator 118 includes a driver 120 that generates a driving force for raising and lowering the support member 119 to raise and lower the lifter 108. The driver 120 includes, for example, a motor (not shown) as a drive source to generate the above driving force.

In one embodiment, each lifter 108 is placed through an insertion hole 121 having its upper end that is open in the upper surface 105a of the support 105. For example, the insertion hole 121 extends vertically through the support 105.

The lifters 108 described above can transfer the edge ring E between the wafer support 101 and the transfer arm 71 in the transfer robot 70.

The lifter 108 and the actuator 118 are included in a lift assembly that raises and lowers the edge ring E relative to the peripheral upper surface 104b, or the ring support surface, of the ESC 104.

The upper electrode 102 also serves as a gas supply, or a shower head, that supplies one or more gases from the gas supply 160 into the chamber 100. In one embodiment, the upper electrode 102 includes a gas inlet 102a, a gas-diffusion compartment 102b, and multiple gas outlets 102c. The gas inlet 102a allows passage of a fluid between the gas supply 160 and the gas-diffusion compartment 102b. The gas outlets 102c allow passage of the fluid between the gas-diffusion compartment 102b and the internal space of the chamber 100. In one embodiment, the upper electrode 102 supplies one or more process gases from the gas inlet 102a through the gas-diffusion compartment 102b and the multiple gas outlets 102c into the chamber 100. The upper electrode 102 may at least partially serve as a cooler for cooling the edge ring E.

The gas supply 160 may include one or more gas sources 161 and one or more flow controllers 162. In one embodiment, the gas supply 160 supplies, for example, one or more gases from the respective gas sources 161 to the gas inlet 102a through the corresponding flow controllers 162. Each flow controller 162 may include, for example, a mass flow controller or a pressure-based flow controller. The gas supply 160 may further include one or more flow rate modulators that supply one or more gases at a modulated flow rate or in a pulsed manner.

The RF power supply 170 provides RF power, such as one or more RF signals, to one or more electrodes, such as the lower electrode 103, the upper electrode 102, or both the lower electrode 103 and the upper electrode 102. This generates plasma from one or more process gases supplied into the chamber 100, or more specifically, into the process space 100s. The RF power supply 170 may thus at least partially serve as a plasma generator that generates plasma in the chamber 100. More specifically, the plasma generator generates plasma from one or more gases in the chamber 100. The RF power supply 170 includes, for example, an RF generator 171a and a matching circuit 172a. In one embodiment, the RF power supply 170 provides an RF signal from the RF generator 171a to the lower electrode 103 through the matching circuit 172a. For example, the RF signal may have a frequency ranging from 27 to 100 MHz.

Although not illustrated, the disclosure may be implemented in other embodiments. In an alternative embodiment, for example, the RF power supply 170 may provide an RF signal from the RF generator 171a to the upper electrode 102. In another alternative embodiment, a DC voltage may be applied to the upper electrode 102.

In various embodiments, one or more RF signals may have pulsed or modulated amplitudes. Such amplitude modulation may include pulse-amplitude modulation of an RF signal between an on-state and an off-state, or between two or more different on-states.

The exhaust system 180 may be connected to, for example, an outlet 100e located in the bottom of the chamber 100. The exhaust system 180 may include a pressure valve and a vacuum pump. The vacuum pump may include a turbomolecular pump, a roughing pump, or a combination of these.

Wafer Processing in Processing Module 60

An example of wafer processing performed in the processing module 60 will now be described. Plasma processing such as etching is performed on a product wafer W as a product substrate in the processing module 60.

The product wafer W held by the transfer arm 71 in the transfer robot 70 is first loaded into the internal space of the chamber 100 by the transfer robot 70. The lifters 107 are raised and lowered and the transfer arm 71 is retracted from the chamber 100 to place the wafer W onto the central upper surface 104a (or the wafer support surface) of the ESC 104. A DC power source 121c then applies a DC voltage to the electrode 110 in the ESC 104 to electrostatically clamp and hold the product wafer W onto the ESC 104. After the product wafer W is loaded, the internal space of the chamber 100 is decompressed to a predetermined degree of vacuum by the exhaust system 180.

The process gas is then supplied from the gas supply 160 into the process space 100s through the upper electrode 102. The RF power supply 170 provides RF power HF for plasma generation to the lower electrode 103 to excite the process gas to generate plasma. To draw ions toward the product wafer W, the bias unit 140 may apply a pulsed bias DC voltage to the electrode 112. The generated plasma then causes plasma processing on the product wafer W.

During the plasma processing, the heat transfer gas is ejected toward the product wafer W clamped and held by the ESC 104.

During the plasma processing, DC power sources 121a and 121b apply a DC voltage to the electrode 111 in the ESC 104 to electrostatically clamp and hold the edge ring E onto the ring support surface including the peripheral upper surface 104b of the ESC 104. To draw ions toward the edge ring E, the bias unit 140 may apply a pulsed bias DC voltage to the electrode 113 during the plasma processing. During the plasma processing, the heat transfer gas supplied from the gas supply 150 is further supplied through the gas outlet hole 104c into the space between the ring support surface and the edge ring E.

To end the plasma processing, the provision of the RF power HF from the RF power supply 170 and the supply of the process gas from the gas supply 160 are stopped. When the bias DC voltage is applied to draw ions during the plasma processing, the bias DC voltage is also stopped. The ESC 104 then stops clamping and holding the product wafer W. The supply of the heat transfer gas to the bottom surface of the wafer W may also be stopped.

The lifters 107 then raise the product wafer W to separate the product wafer W from the ESC 104. During the separation, static electricity is eliminated from the product wafer W. The product wafer W is then unloaded from the chamber 100 by the transfer robot 70, and the wafer processing ends.

Installation Sequence in Example 1

Figure 5:
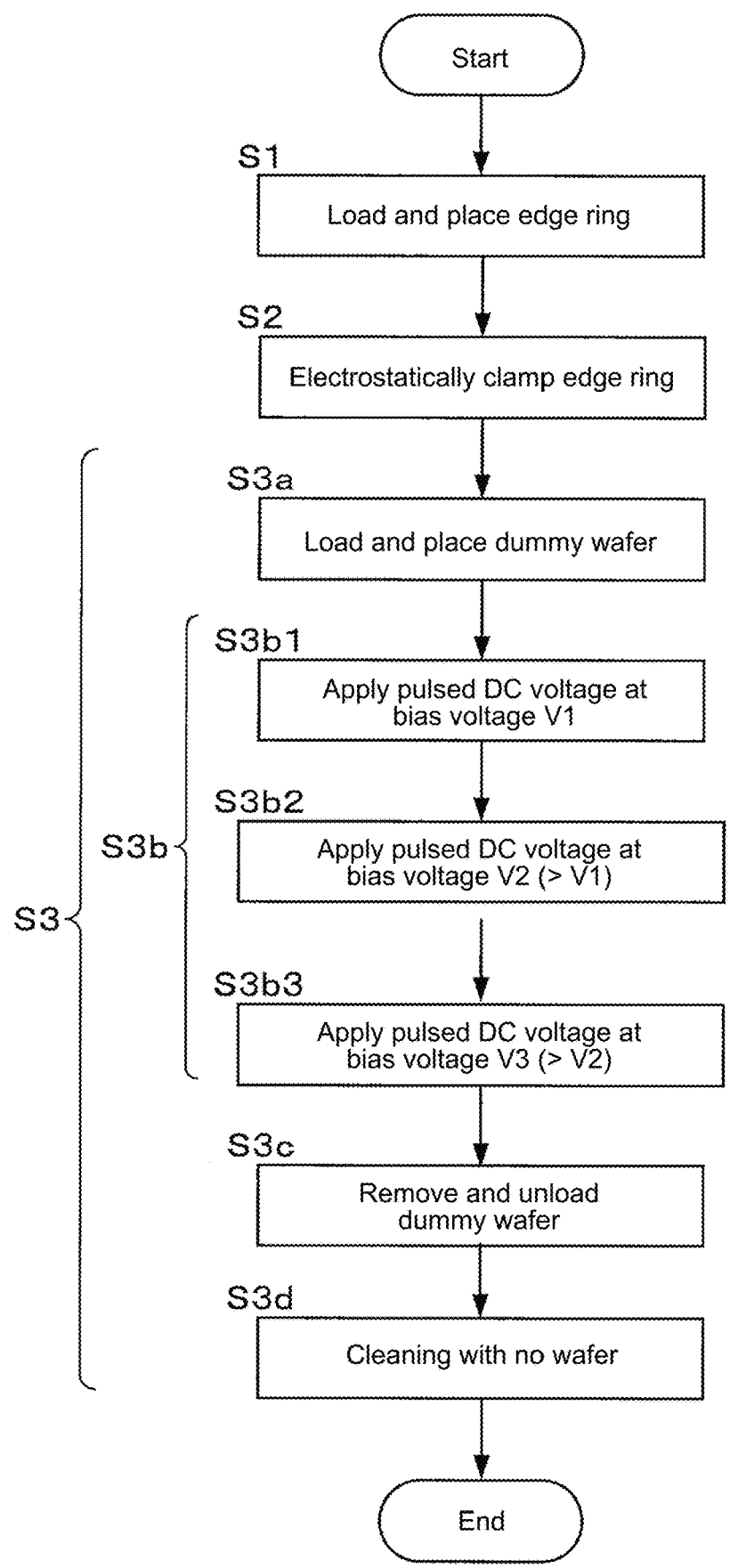
FIG. 5 is a flowchart of an installation sequence of an edge ring in Example 1.

An example installation sequence of installing the edge ring E into the internal space of the processing module 60 performed by the plasma processing system 1 will now be described. FIG. 5 is a flowchart of the installation sequence of the edge ring E in Example 1. Each of the steps below is performed by the plasma processing system 1 under the control of the controller 80 (specifically, the processor 91) performing calculations based on the program stored in the storage 92.

As shown in, for example, FIG. 5, the edge ring E loaded into the chamber 100 and transferred to the lift assembly including the lifter 108 by the transfer robot 70 is lowered and placed onto the ring support surface by the lift assembly (step S1). Step S1 is performed with no wafer W in the chamber 100.

More specifically, in step S1, for example, the edge ring E in the storage module 61 is first loaded into, by the transfer robot 70, the chamber 100 in the processing module 60 into which the edge ring E is to be installed.

More specifically, for example, the edge ring E in the storage module 61 is held by the transfer arm 71 in the transfer robot 70. The gate valve 62 corresponding to the processing module 60 into which the edge ring E is to be installed is open, and the transfer arm 71 holding the edge ring E is placed into the chamber 100 through a port for loading and unloading (not shown). The edge ring E is then transferred by the transfer arm 71 to above the peripheral upper surface 104b of the ESC 104 and the upper surface 105a of the support 105. No wafer W is placed on the central upper surface 104a of the ESC 104 in this state.

The edge ring E is then transferred from the transfer robot 70 to the lifters 108.

More specifically, all the lifters 108 are raised to transfer the edge ring E from the transfer arm 71 to the lifters 108. The transfer arm 71 is then retracted from the chamber 100, and the gate valve 62 is closed.

The edge ring E is then lowered and placed onto the peripheral upper surface 104b, or the ring support surface, of the ESC 104 by the lift assembly including the lifter 108.

More specifically, the lifters 108 are lowered until the upper ends of the lifters 108 are retracted into the respective insertion holes 121. Thus, the edge ring E is placed onto the peripheral upper surface 104b, or the ring support surface, of the ESC 104.

The placed edge ring E is then electrostatically clamped onto the ring support surface (step S2).

More specifically, a voltage is applied to the electrode 111 in the ESC 104 with no wafer W in the chamber 100.

More specifically, with no wafer W in the chamber 100 and with the edge ring E on the peripheral upper surface 104b, or the ring support surface, of the ESC 104, the DC power sources 121a and 121b are turned on. This causes, for example, a negative DC voltage to be applied to the electrodes 111a and 111b in the ESC 104.

The edge ring E may be clamped under vacuum before electrostatically clamped. More specifically, the gas around the ring support surface may be evacuated through the gas outlet hole 104c, which also serves as an exhaust hole.

More specifically, the switch valve 182 may be open, and the exhaust system 180 may evacuate the gas around the peripheral upper surface 104b of the ESC 104 and the upper surface 105a of the support 105 through the gas outlet hole 104c. Thus, the edge ring E is clamped onto the peripheral upper surface 104b, or the ring support surface, of the ESC 104 under vacuum.

Plasma is then generated in the chamber 100 and the electrostatically clamping of the edge ring E onto the ESC 104 is stabilized with the plasma before plasma processing is performed on the product wafer W (step S3), or in other words, a stable clamping of the edge ring E is performed. The stable clamping of the edge ring E is thus a process to increase an electrostatic clamping force of the edge ring E onto the ESC 104.

More specifically, in step S3, for example, a dummy wafer W as a dummy substrate different from the product substrate is first loaded into the chamber 100 and placed onto the wafer support surface (step S3a).

The dummy wafer W is stored in, for example, a FOUP 31. The dummy wafer W is placed onto the wafer support surface in the same manner as the wafer W placed onto the wafer support surface in the wafer processing performed by the processing module 60 as described above. The placed dummy wafer W is electrostatically clamped onto the ESC 104.

In step S3, the stable clamping of the edge ring E is performed subsequent to step S3a (step S3b). Step S3b includes a first process (step S3b1) and a second process (step S3b2).

More specifically, in step S3b, a gas for the stable clamping is supplied from the gas supply 160 into the process space 100s through the upper electrode 102, with the dummy wafer W electrostatically clamped on the wafer support surface and the edge ring E electrostatically clamped on the ring support surface. The RF power supply 170 provides RF power HF for plasma generation to, for example, the lower electrode 103 to excite the gas to generate plasma. Electric charge (specifically, for example, ions) moves from the generated plasma to the edge ring E, increasing the amount of electrostatic charge on the edge ring E. The edge ring E can thus have a higher electrostatic clamping force onto the ESC 104.

The RF power HF for plasma generation may be provided to the upper electrode 102.

In the stable clamping in step S3b, the bias unit 140 applies a pulsed negative bias DC voltage to the wafer support 101 to draw ions toward the edge ring E. As described above, step S3b includes the first process and the second process. In the first process, a pulsed negative DC voltage is applied at the first bias voltage. In the second process, a pulsed negative DC voltage is applied at a second bias voltage higher than the first bias voltage (in other words, with an absolute value greater than the first bias voltage) after the first process.

In the first process (step S3b1), for example, a pulsed negative DC voltage at a first bias voltage V1 (e.g., 1000 to 3000 V) is applied to the electrode 113 in the peripheral portion of the ESC 104 for a predetermined time T1 (e.g., 10 to 120 seconds). In the second process (step S3b2), a pulsed negative DC voltage at a second bias voltage V2 (e.g., 3000 to 5000 V) higher than the first bias voltage V1 is applied to the electrode 113 for a predetermined time T2 (e.g., 10 to 120 seconds). In one example, the predetermined time T1 may be equal to the predetermined time T2.

In each of the first and second processes, the pulsed negative bias DC voltage is continuously applied to the electrode 113. In at least one of the first process or the second process, the pulsed negative bias DC voltage may be intermittently applied to the electrode 113.

Step S3b may include, after the second process, a third process (step S3b3) in which a pulsed negative bias DC voltage is applied at a third bias voltage V3 higher than the second bias voltage V2.

In the third process, for example, the pulsed negative DC voltage is applied to the electrode 113 at the third bias voltage V3 (e.g., 5000 to 6000 V) higher than the second bias voltage V2 for a predetermined time T3 (e.g., 30 to 150 seconds). In one example, the predetermined time T3 may be longer than the predetermined time T1 and the predetermined time T2.

In the third process, the pulsed negative bias DC voltage may be intermittently applied to the electrode 113, or more specifically, intermittently and periodically applied to the electrode 113 at a predetermined duty ratio. In the third process, the pulsed negative bias DC voltage may be continuously applied to the electrode 113.

During the stable clamping, a bias DC voltage may be applied to or bias RF power may be provided to the electrode 112 in the central portion of the ESC 104 to draw ions toward During the stable clamping, the dummy wafer W may be electrostatically clamped on the ESC 104.

During the stable clamping, the heat transfer gas supplied from the gas supply 150 may be supplied through the gas outlet hole 104c into the space between the peripheral upper surface 104b, or the ring support surface, of the ESC 104 and the edge ring E.

To end the stable clamping, the provision of the RF power HF from the RF power supply 170 and the supply of the gas for the stable clamping from the gas supply 160 are stopped. When the electrostatic clamping of the dummy wafer W, the application of the bias DC voltage (or the provision of the bias RF power) to the dummy wafer W, and the supply of the above heat transfer gas are performed during the plasma processing, they are also stopped.

In step S3 after the stable clamping in step S3*b*, the dummy wafer W is removed from the wafer support surface and unloaded from the chamber 100 (step S3*c*).

This process is performed using the lifters 107 and the transfer robot 70.

Steps S3*a* to S3*c* may be repeated multiple times. More specifically, steps S3*a* to S3*c* may be performed for each of multiple dummy wafers W.

In step S3 after the stable clamping in step S3*b*, plasma is generated in the chamber 100 with no wafer W on the wafer support surface of the ESC 104, and the ESC 104 is cleaned with plasma (step S3*d*).

More specifically, the above cleaning includes supplying, after the dummy wafer W is unloaded in step S3*c*, a cleaning gas from the gas supply 160 into the process space 100*s* through the upper electrode 102 with no wafer W on the central upper surface 104*a*, or the wafer support surface, of the ESC 104. In this state, the edge ring E remains electrostatically clamped on the ESC 104. The RF power supply 170 provides RF power HF for plasma generation to, for example, the lower electrode 103 to excite the gas to generate plasma. The generated plasma can remove reaction products adhering to, for example, a portion between the central portion of the ESC 104 and the edge ring E.

The RF power HF for plasma generation may be provided to the upper electrode 102.

The cleaning in step S3*d* is, for example, performed for each dummy wafer W. More specifically, the cleaning in step S3*d* is, for example, performed every time when step S3*c* ends.

Step S3*d* may be eliminated.

This completes the installation sequence.

Main Effects of Installation Sequence in Example 1

In the installation sequence in Example 1, the edge ring E loaded into the chamber 100 and transferred to the lift assembly including the lifters 108 by the transfer robot 70 is lowered and placed onto the ring support surface by the above lift assembly. The placed edge ring E is electrostatically clamped onto the ring support surface. In the installation sequence in Example 1, plasma is generated in the chamber 100 and the electrostatically clamping of the edge ring E onto the ESC 104 is stabilized with the plasma before performing plasma processing on the product wafer W. The edge ring E can thus have a higher electrostatic clamping force onto the ESC 104. In other words, the edge ring E can be electrostatically clamped onto the wafer support 101 appropriately.

In the installation sequence in Example 1, the stable clamping includes applying a pulsed bias DC voltage to the wafer support 101. The above applying process includes the first process of applying the first bias voltage V1 and the second process of applying the second bias voltage higher than the first bias voltage V1 after the first process. At the beginning of the above applying process, the edge ring E may have a lower electrostatic clamping force onto the ESC 104. Thus, applying a high bias voltage to the ESC 104 may cause electric discharge between the ring support surface of the ESC 104 and the edge ring E, possibly damaging at least one of the ESC 104 or the edge ring E. In response to this, the installation sequence in Example 1 includes applying the bias pulsed bias DC voltage to the wafer support 101 at a higher voltage in the second process than in the first process. More specifically, the applied voltage is lower in the first process than in the second process. This reduces the likelihood of such electric discharge. The installation sequence in Example 1 efficiently allows the edge ring E to have a higher electrostatic clamping force onto the ESC 104 in the process of applying a pulsed bias DC voltage than when the applied bias voltage remains as low as in the first process until the end, unlike in the present example. Additionally, the installation sequence in Example 1 allows more heat to be input into the edge ring E from the plasma in the process of applying a pulsed bias DC voltage than when the applied bias voltage remains as low as in the first process until the end, unlike in the present example. This structure can efficiently remove moisture on the edge ring E that may cause the above electric discharge.

In the installation sequence in Example 1, the process of applying a pulsed bias DC voltage further includes the third process of applying, after the second process, a pulsed bias DC voltage at the third bias voltage V3 higher than the second bias voltage V2. This structure allows the edge ring E to more efficiently have a higher electrostatic clamping force onto the ESC 104 while reducing electric discharge between the ring support surface of the ESC 104 and the edge ring E.

The inventors have noticed through repeated experiments that, when a pulsed bias DC voltage is applied continuously to the wafer support 101 at a high bias voltage as in the third process, the upper electrode 102 may be damaged due to the nonuniform temperature distribution across the surface of the upper electrode 102. In this case, a pulsed bias DC voltage is intermittently applied to the wafer support 101 in the process of applying a high bias voltage as in the third process to reduce the damage to the upper electrode 102 described above.

Installation Sequence in Example 2

Figure 6:
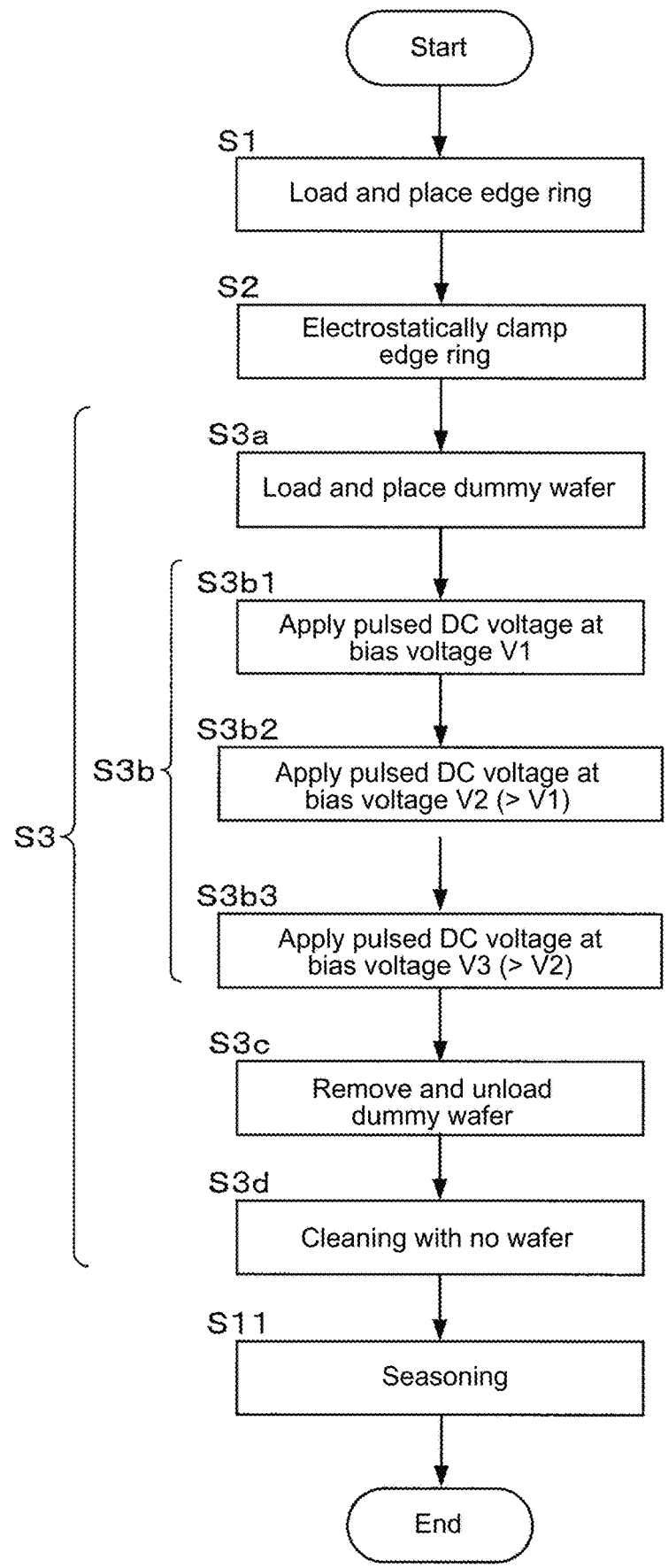
FIG. 6 is a flowchart of an installation sequence of the edge ring in Example 2.

FIG. 6 is a flowchart of an installation sequence of the edge ring E in Example 2.

The installation sequence in Example 2 includes seasoning the internal space of the chamber 100 after the stable clamping in step S3*b* and before performing the plasma processing on the product wafer W (step S11), in addition to all steps S1 to S3 in the installation sequence in Example 1.

More specifically, after step S3, for example, the dummy wafer W is loaded into the chamber 100, placed onto the wafer support surface, and electrostatically clamped as in step S3*a*.

A seasoning gas is then supplied from the gas supply 160 into the process space 100*s* through the upper electrode 102, with the dummy wafer W electrostatically clamped on the wafer support surface and the edge ring E electrostatically clamped on the ring support surface. The RF power supply 170 provides RF power HF for plasma generation to, for example, the lower electrode 103 to excite the gas to generate plasma. The generated plasma forms a predetermined amount of film on the inner wall of the chamber 100, thus seasoning the internal space of the chamber 100 to allow the internal space to be stable.

The RF power HF for plasma generation may be provided to the upper electrode 102.

During the seasoning, the edge ring E remains electrostatically clamped on the ESC 104. During the seasoning, the dummy wafer W may be electrostatically clamped on the ESC 104.

To end the seasoning, the provision of the RF power HF from the RF power supply 170 and the supply of the seasoning gas from the gas supply 160 are stopped. When the clamping is performed during the plasma processing, electrostatic clamping of the dummy wafer W is also stopped.

The dummy wafer W is then removed from the wafer support surface and unloaded from the chamber 100 as in step S3c.

When no cleaning in step S3d is performed, the dummy wafer W used in the stable clamping in step S3b may also be used in the seasoning in step S11 without being removed from the wafer support 101. When the internal space of the chamber 100 is not damaged by the cleaning after the seasoning, the dummy wafer W used in the stable clamping in step S3b may also be used in the seasoning in step S11 without being removed from the wafer support 101. The cleaning in step S3d may be performed after the dummy wafer W is unloaded from the chamber 100.

However, the seasoning of the internal space of the chamber 100 may be performed with no dummy wafer W on the wafer support surface.

Installation Sequence in Example 3

In the above example, the bias unit 140 applies a pulsed bias DC voltage to draw ions from the plasma generated in the chamber 100 toward the edge ring E. In another example, bias RF power may be provided instead. In this case, the bias power source 141a in the bias unit 140 provides bias RF power to the electrode 113.

Figure 7:
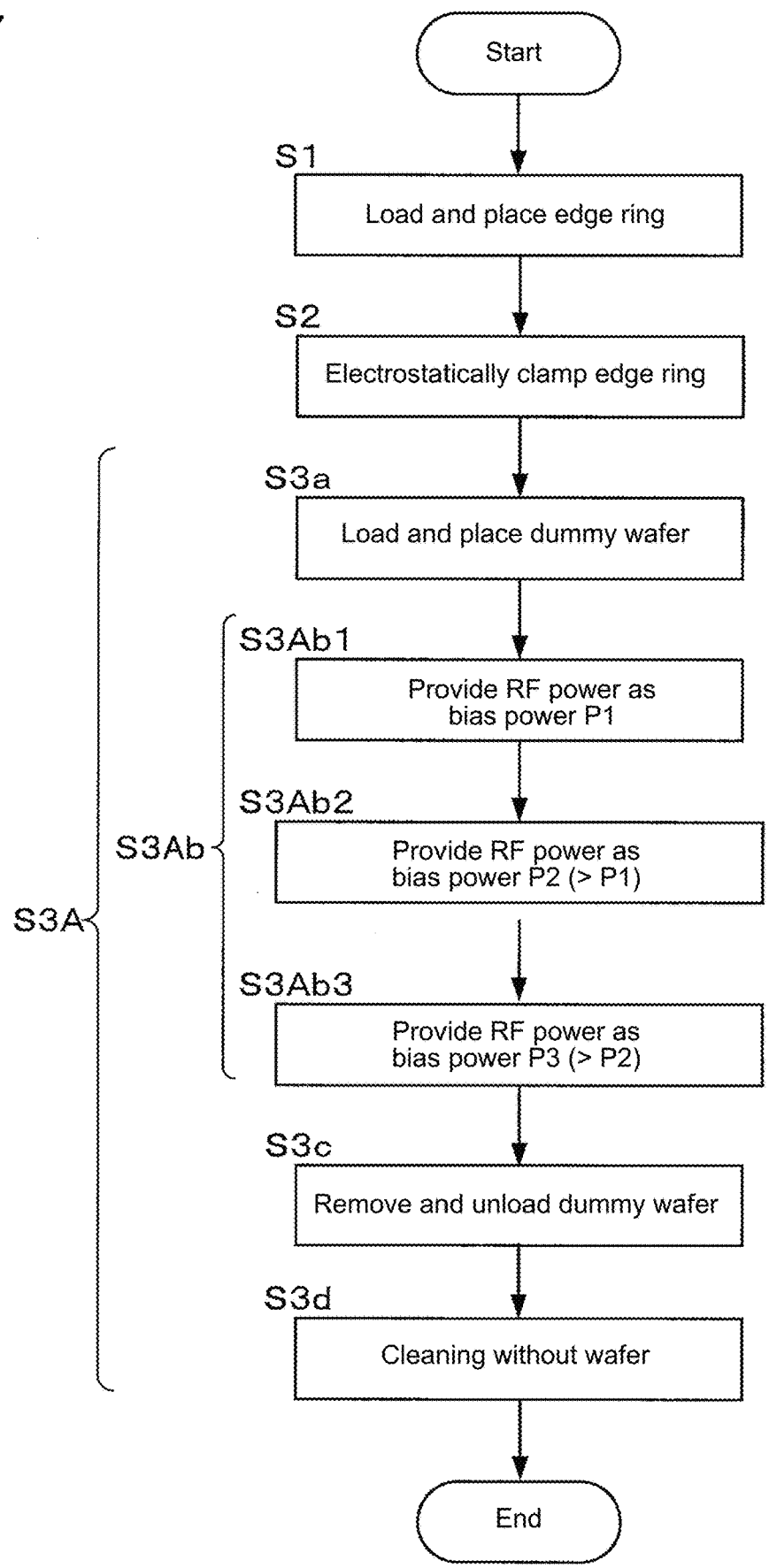
FIG. 7 is a flowchart of an installation sequence of the edge ring in Example 3.

In the installation sequence in Example 3 in which bias RF power is provided, steps S1 and S2 in the installation sequence in Example 1 are performed first as shown in FIG. 7.

Plasma is then generated in the chamber 100 and the electrostatically clamping of the edge ring E onto the ESC 104 is stabilized with the plasma before plasma processing is performed on the product wafer W (step S3A).

In step S3A, the above step S3a is performed to place the dummy wafer W onto the wafer support surface.

In step S3A, the clamping of the edge ring E is stabilized subsequently to step S3a (step S3Ab). Step S3Ab includes a first process (step S3Ab1) and a second process (step S3Ab2).

More specifically, in step S3Ab, a gas for the stable clamping is supplied from the gas supply 160 into the process space 100s through the upper electrode 102, with the dummy wafer W electrostatically clamped on the wafer support surface and the edge ring E electrostatically clamped on the ring support surface. The RF power supply 170 provides RF power HF for plasma generation to, for example, the lower electrode 103 to excite the gas to generate plasma. Electric charge (specifically, for example, ions) moves from the generated plasma to the edge ring E, increasing the amount of electrostatic charge on the edge ring E. The edge ring E can thus have a higher electrostatic clamping force onto the ESC 104.

The RF power HF for plasma generation may be provided to the upper electrode 102.

In the stable clamping in step S3Ab, the bias unit 140 provides bias RF power to the wafer support 101 to draw ions toward the edge ring E. As described above, step S3Ab includes the first process and the second process. In the first process, the RF power is provided as first bias power P1. In the second process, the RF power is provided as second bias power P2 greater than the first bias power P1 after the first process.

In the first and second processes, the bias RF power is continuously provided to the electrode 113. In at least one of the first process or the second process, the bias RF power may be intermittently provided to the electrode 113.

Step S3Ab may include, after the second process, a third process (step S3Ab3) in which the bias RF power is provided as third bias power P3 greater than the second bias power P2.

In the third process, the bias RF power may be intermittently provided to the electrode 113, or more specifically, intermittently and periodically provided to the electrode 113 at a predetermined duty ratio. In the third process, the bias RF power may be continuously provided to the electrode 113. The duty ratio herein refers to the ratio of the period in which the bias power is provided to the total period in a cycle.

During the stable clamping, a bias DC voltage may be applied to or bias RF power may be provided to the electrode 112 in the central portion of the ESC 104 to draw ions toward During the stable clamping, the dummy wafer W may be electrostatically clamped on the ESC 104.

The other processing in step S3A is the same as the processing in step S3 in the above installation sequence in Example 1.

As in the installation sequence in Example 1, the structure in this example also allows the edge ring E to have a higher electrostatic clamping force onto the ESC 104 efficiently while reducing electric discharge between the ring support surface of the ESC 104 and the edge ring E. In the present example as well, this structure can efficiently remove moisture on the edge ring E.

In the present example, the process of providing bias RF power further includes, after the second process, the third process of providing bias RF power as the third bias power P3 greater than the second bias power P2. Thus, as in the installation sequence in Example 1, this structure also allows the edge ring E to more efficiently have a higher electrostatic clamping force onto the ESC 104 while reducing electric discharge between the ring support surface of the ESC 104 and the edge ring E.

In the present example, the bias RF power is intermittently provided to the wafer support 101 in the process of providing greater bias power as in the third process. This reduces damage to the upper electrode 102 as in the installation sequence in Example 1.

In the present example, bias RF power may be provided to draw ions toward the wafer W.

Installation Sequence in Example 4

Figure 8:
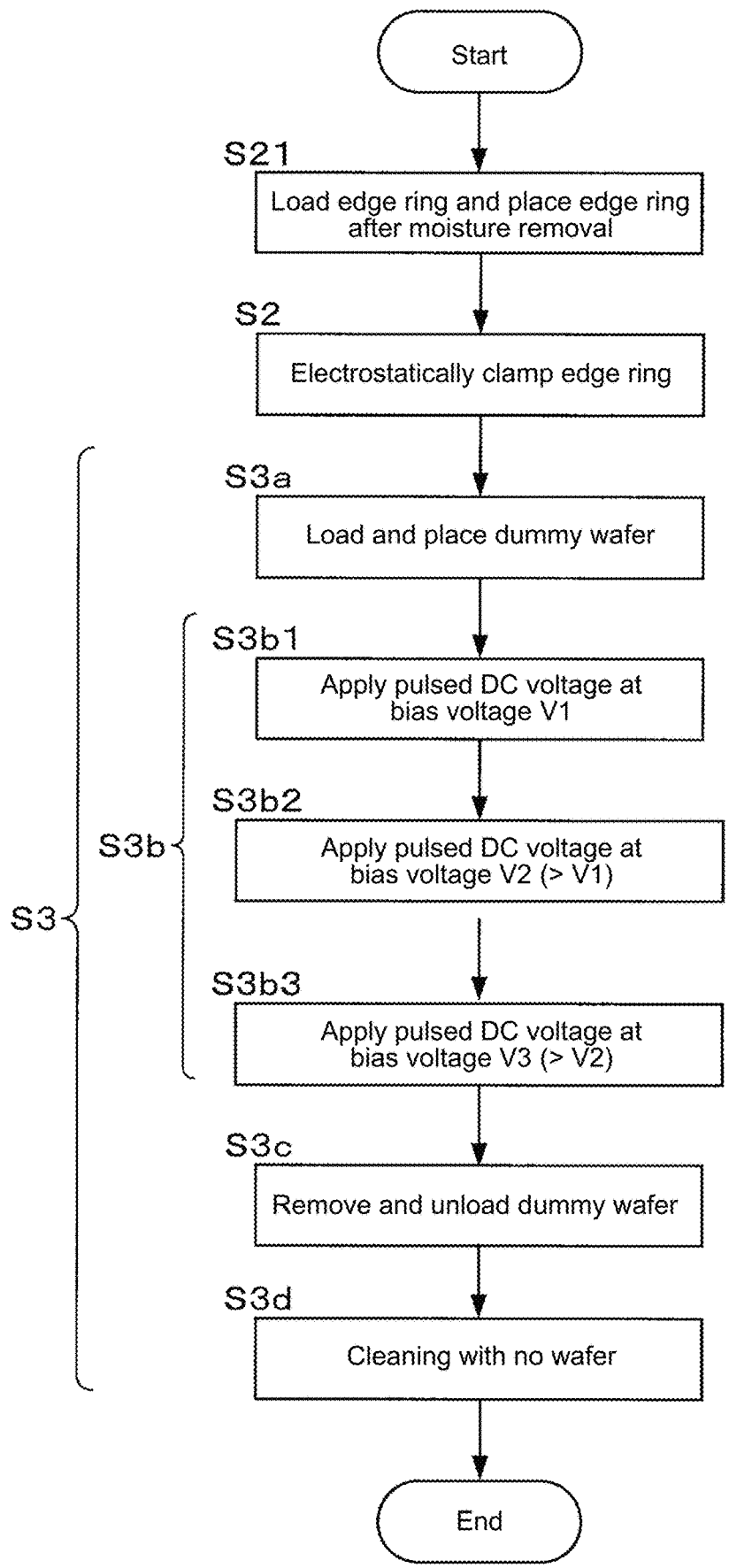
FIG. 8 is a flowchart of an installation sequence of the edge ring in Example 4.
Figure 9:
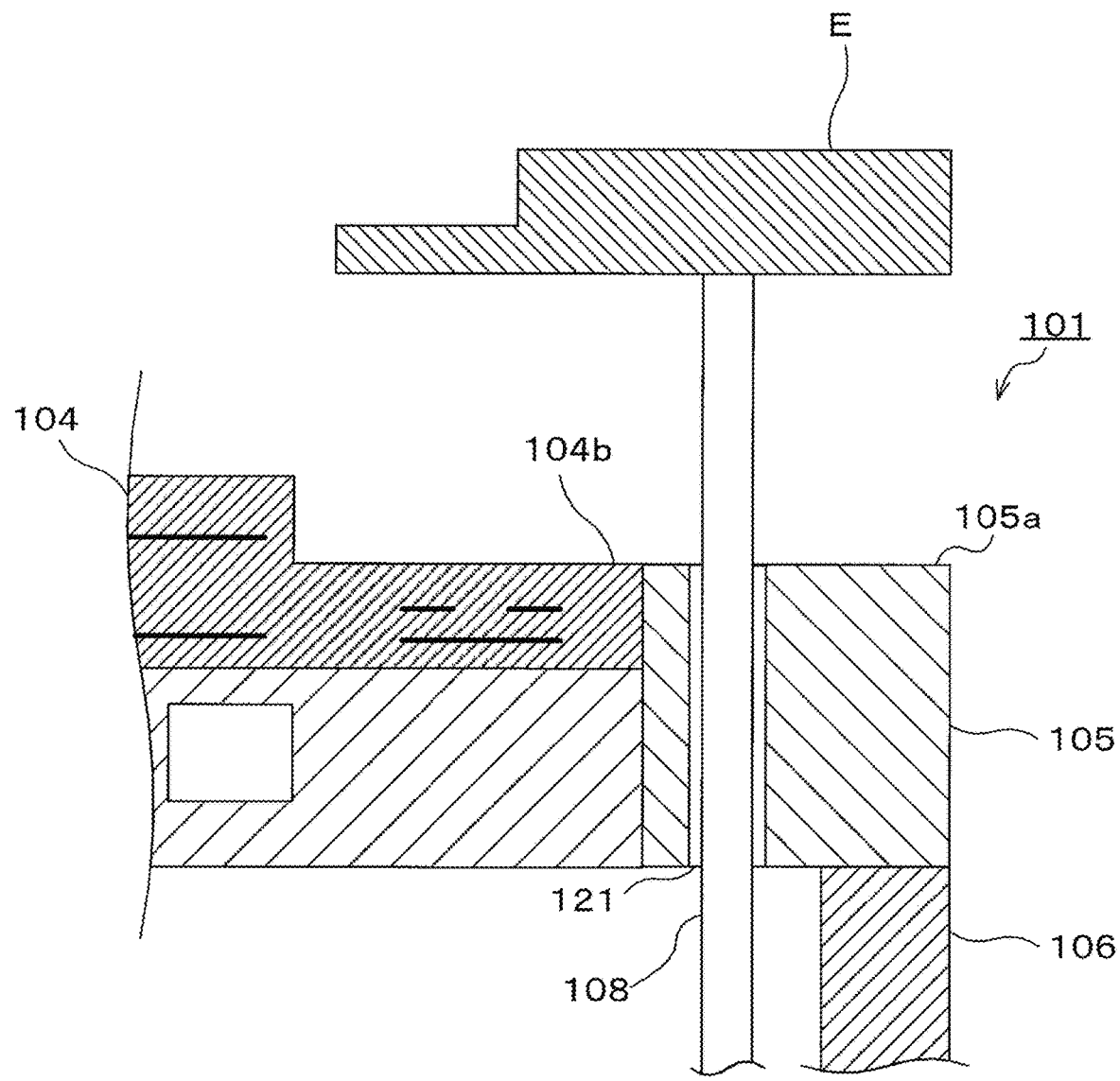
FIG. 9 is a diagram of a portion surrounding the wafer support during removal of moisture from the edge ring.

FIG. 8 is a flowchart of an installation sequence of the edge ring E in Example 4. FIG. 9 is a diagram of a portion surrounding the wafer support 101 in step S21 (described later), or in other words, during removal of moisture from the edge ring E.

In the installation sequence in Example 4, as shown in FIG. 8, the edge ring E is loaded into the chamber 100, and moisture is removed from the edge ring E in the chamber 100. The edge ring E is then placed onto the ring support surface (step S21). In other words, the edge ring E loaded into the chamber 100 undergoes moisture removal in the chamber 100 before the edge ring E is placed onto the ring support surface.

More specifically, as shown in FIG. 9, before the edge ring E is placed onto the ring support surface including the peripheral upper surface 104b of the ESC 104, plasma is generated in the chamber 100 with the edge ring E separated from the ring support surface by the lift assembly including the lifters 108, and moisture is removed from the edge ring E.

More specifically, for example, the edge ring E in the storage module 61 is first loaded into, by the transfer robot 70, the chamber 100 in the processing module 60 into which the edge ring E is to be installed as in step S1.

The edge ring E is then transferred from the transfer robot 70 to the lifters 108 as in step S1.

Unlike in step S1, plasma is then generated in the chamber 100 and moisture on the surface of the edge ring E is removed.

More specifically, a moisture removal gas is supplied from the gas supply 160 into the process space 100s through the upper electrode 102, with the edge ring E separated from the ring support surface of the ESC 104 by the lift assembly including the lifters 108. The RF power supply 170 provides RF power HF for plasma generation to, for example, the lower electrode 103 to excite the gas to generate plasma. The generated plasma heats, vaporizes, and removes moisture on the edge ring E directly or through the edge ring E. In particular, moisture on the back surface (or the surface adjacent to the ring support surface) of the edge ring E is also removable although such moisture is less likely to be removed when the edge ring E is placed on the ring support surface.

The time taken to generate plasma in step S21 may be several tens of seconds.

During the moisture removal or during the plasma generation, the edge ring E may be at a position higher or lower than the position of the wafer W transferred from the transfer robot 70 to the lifters 108 when the plasma is generated under the edge ring.

The moisture removal gas may be an oxygen gas, a nitrogen gas, or a noble gas such as an argon gas.

The RF power HF for plasma generation may be provided to the upper electrode 102. The conditions for generating plasma in step S21 (e.g., the pressure in the chamber 100 and the magnitude of RF power HF for plasma generation) may be the same as the conditions for generating plasma in the cleaning process in step S3d. This reduces damage to the ESC 104 caused by plasma.

To end the moisture removal, the provision of the RF power HF from the RF power supply 170 and the supply of the moisture removal gas from the gas supply 160 are stopped.

In step S21, the edge ring E is then lowered and placed onto the ring support surface of the ESC 104 by the lift assembly including the lifters 108 as in step S1.

In this example, moisture is removed from the edge ring E before the edge ring E is placed onto the ring support surface. This reduces moisture-caused electric discharge between the ring support surface of the ESC 104 and the edge ring E.

In the example in FIG. 8, steps S2 and S3 alone in the process sequence in Example 1 are performed after the moisture removal process performed on the edge ring E in step S21. In another example, step S11 in the process sequence in Example 2 may also be performed. After the moisture removal process performed on the edge ring E in step S21, steps S2 and S3A in the process sequence in Example 3 may be performed.

In the above example, no wafer is placed on the central upper surface 104a, or the wafer support surface, of the ESC 104 during the plasma generation in the moisture removal process performed on the edge ring E in step S21. In another example, a small wafer may be placed on the central upper surface 104a. The small wafer refers to a wafer placeable on the wafer support surface without interference with the edge ring E that is to be raised or lowered. The small wafer has a diameter to fully cover the wafer support surface.

To remove moisture from the edge ring E, the edge ring E may be left for, for example, at least one hour with the edge ring E separated from the ring support surface by the lift assembly including the lifters 108 without generating plasma in the chamber 100. However, moisture is efficiently removed from the edge ring E when plasma is used.

Other Modifications

In the above examples, the stable clamping is performed with the dummy wafer W on the central upper surface 104a, or the wafer support surface, of the ESC 104. In another example, the stable clamping may be performed with no dummy wafer W on the central upper surface 104a. However, the stable clamping with the dummy wafer W on the wafer support surface reduces damage to the ESC 104, for example, the central upper surface 104a, caused by plasma.

A cover ring may be placed on the wafer support used in the plasma processing apparatus, in addition to the edge ring E. The cover ring covers the outer surface of the edge ring. The technique according to one or more embodiments of the disclosure may also be used in this structure.

Figure 10:
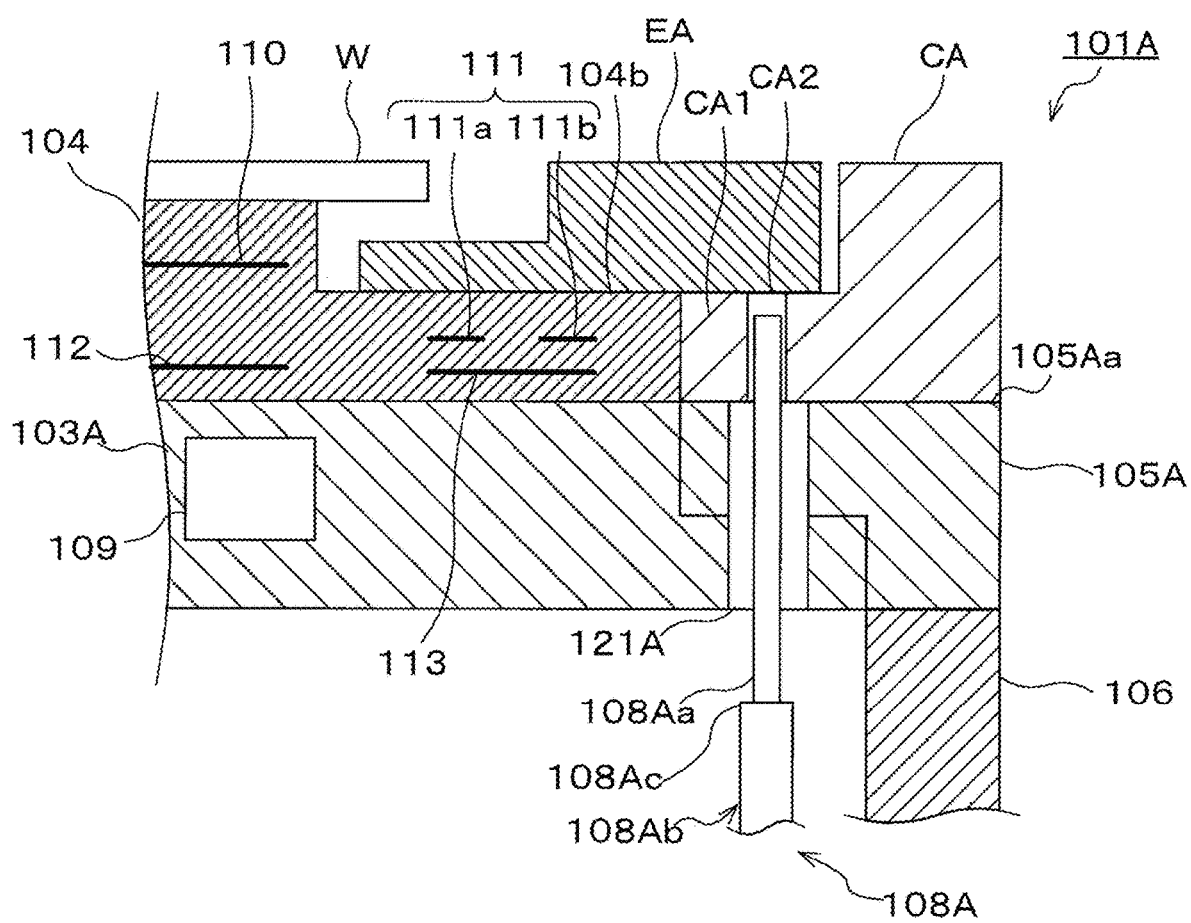
FIG. 10 is a partially enlarged view of an example wafer support on which a cover ring is placeable in addition to the edge ring.

FIG. 10 is a partially enlarged view of an example wafer support on which a cover ring CA is placeable in addition to an edge ring EA.

The wafer support 101A in FIG. 10 will be described focusing on its differences from the wafer support 101 shown in, for example, FIG. 3.

The wafer support 101A in FIG. 10 includes a lower electrode 103A, a support 105A, and lifters 108A, in addition to the ESC 104, the insulator 106, and the lifters 107 similarly to the wafer support 101 shown in, for example, FIG. 2. The wafer support 101A receives both the edge ring EA and the cover ring CA.

A lower outer peripheral portion of the lower electrode 103A and an upper inner peripheral portion of the support 105A overlap each other in a plan view. The lower electrode 103A and the support 105A each have insertion holes 121A through which the respective lifters 108A are placed. Each insertion hole 121A extends downward from an upper surface 105Aa of the inner peripheral portion of the support 105A to the bottom surface of the lower outer peripheral portion of the lower electrode 103A.

The ESC 104 is located above the lower electrode 103A. The edge ring EA is placed on the peripheral upper surface 104b of the ESC 104. The cover ring CA is placed on the upper surface 105Aa of the support 105A. The upper surface 105Aa of the support 105A has substantially the same height as the upper surface of the lower electrode 103A.

The edge ring EA has a larger outer diameter than the ESC 104. The edge ring EA placed on the peripheral upper surface 104b of the ESC 104 thus has its peripheral portion protruding from the peripheral portion of the ESC 104.

The cover ring CA covers the outer surface of the edge ring EA. The cover ring CA is annular in a plan view, similarly to the edge ring EA. In one embodiment, the cover ring CA includes a protrusion CA1 protruding radially inward at its bottom.

The cover ring CA has through-holes CA2 at the positions corresponding to the lifters 108A. Each through-hole CA2 receives the corresponding lifter 108A. Each through-hole CA2 extends from the bottom surface of the cover ring CA to the edge ring EA. The through-holes CA2 are in a portion (specifically, for example, the protrusion CA1) overlapping the inner peripheral portion of the cover ring CA. The inner peripheral portion of the cover ring CA overlaps the peripheral portion of the edge ring EA in a plan view.

Each lifter 108A can protrude from the upper surface 105Aa of the inner peripheral portion of the support 105A to be raised and lowered with an intended amount of protrusion from the upper surface 105Aa in an adjustable manner. More specifically, each lifter 108A protrudes from the upper surface 105Aa of the inner peripheral portion of the support 105A at a position overlapping the edge ring EA and the cover ring CA in a plan view. The insertion holes 121A, through which the respective lifters 108A are placed, are at positions overlapping the edge ring EA and the cover ring CA in a plan view.

Similarly to the lifters 108 in FIG. 3, three or more lifters 108A are arranged at intervals in the circumferential direction of the ESC 104.

Each lifter 108A includes a first engagement portion 108Aa and a second engagement portion 108Ab.

The first engagement portion 108Aa is an upper portion of the lifter 108A. The first engagement portion 108Aa protrudes upward from the through-hole CA2 in the cover ring CA and engages with the edge ring E. When the lifter 108A is raised, the first engagement portion 108Aa extends through the through-hole CA2 in the cover ring CA to come in contact with the bottom surface of the edge ring EA and supports the edge ring EA from the bottom surface.

The second engagement portion 108Ab is located below the first engagement portion 108Aa and is engageable with the cover ring CA. The second engagement portion 108Ab comes in contact with the bottom surface of the cover ring CA without extending through the corresponding through-hole CA2 in the cover ring CA to support the cover ring CA from the bottom surface.

The second engagement portion 108Ab is joined to the basal end of the first engagement portion 108Aa in the axial direction of the lifter 108A. The second engagement portion 108Ab includes, at a joint with the first engagement portion 108Aa, a protrusion 108Ac protruding outward from the outer circumference of the first engagement portion 108Aa.

The first engagement portion 108Aa, the second engagement portion 108Ab, and the protrusion 108Ac may have any specific shapes. For example, the first engagement portion 108Aa, the second engagement portion 108Ab, and the protrusion 108Ac may be cylindrical and coaxial with one another.

Each actuator 118 described above raises and lowers the corresponding lifter 108A with the cover ring CA engaged with the second engagement portion 108Ab to raise and lower the cover ring CA.

Each actuator 118 also raises and lowers the corresponding lifter 108A with the edge ring E engaged with the first engagement portion 108Aa to raise and lower the edge ring EA.

When the wafer support 101A is used, the edge ring EA may be installed alone or together with the cover ring CA.

To install the edge ring EA alone, the edge ring EA is placed onto the wafer support 101 in the manner described below.

For example, the edge ring EA in the storage module 61 is loaded into, by the transfer robot 70, the chamber 100 in the processing module 60 into which the edge ring EA is to be installed.

More specifically, the edge ring EA in the storage module 61 is held by the transfer arm 71 in the transfer robot 70. The transfer arm 71 holding the edge ring EA is then placed into, through the port for loading and unloading (not shown), the chamber 100 in the processing module 60 into which the edge ring EA is to be installed. The edge ring EA is then transferred by the transfer arm 71 to above the peripheral upper surface 104b of the ESC 104. The cover ring CA is placed on the upper surface 105a of the support 105.

The edge ring E is then placed onto the ESC 104 from the transfer robot 70.

More specifically, all the lifters 108A are raised to transfer the edge ring EA from the transfer arm 71 to the first engagement portions 108Aa in the lifters 108A extending through the respective through-holes CA2 in the cover ring CA. Each lifter 108A is raised until the top end of the first engagement portion 108Aa reaches a predetermined height. The predetermined height refers to a height at which the transfer arm 71 does not interfere with, for example, the edge ring EA and the cover ring CA when the transfer arm 71 is inserted into or retracted from a space between the cover ring CA placed on the support 105A and the edge ring EA supported on the first engagement portions 108Aa.

The transfer arm 71 is then retracted from the chamber 100. The lifters 108A are lowered. Thus, the edge ring EA is placed onto the peripheral upper surface 104b of the ESC 104.

To install the edge ring EA with the cover ring CA, the edge ring EA is placed onto the wafer support 101 in the manner described below.

For example, the cover ring CA supporting the edge ring EA in the storage module 61 is loaded into, by the transfer robot 70, the chamber 100 in the processing module 60 into which the edge ring EA and the cover ring CA are to be installed.

More specifically, the cover ring CA supporting the edge ring EA in the storage module 61 is held by the transfer arm 71 in the transfer robot 70. The transfer arm 71 holding the cover ring CA is then placed into, through the port for loading and unloading (not shown), the chamber 100 in the processing module 60 into which the cover ring CA is to be installed. The cover ring CA supporting the edge ring EA is then transferred by the transfer arm 71 to above the peripheral upper surface 104b of the ESC 104 and the upper surface 105Aa of the support 105A.

The edge ring EA and the cover ring CA are then placed onto the ESC 104 and the support 105A from the transfer robot 70.

More specifically, all the lifters 108 are raised to transfer the edge ring EA from the cover ring CA held by the transfer arm 71 to the first engagement portions 108Aa in the lifters 108A extending through the respective through-holes CA2 in the cover ring CA. All the lifters 108A then continue to be raised, and the cover ring CA is transferred from the transfer arm 71 to the second engagement portions 108Ab in the lifters 108A. Each lifter 108A is raised until the top end of the second engagement portion 108Ab reaches a predetermined height. The predetermined height refers to a height at which the transfer arm 71 does not interfere with, for example, the cover ring CA when the transfer arm 71 is inserted into or retracted from a space between the central upper surface 104a of the ESC 104 and the cover ring CA supported by the second engagement portions 108Ab.

The transfer arm 71 is then retracted from the chamber 100. The lifters 108A are lowered. Thus, the edge ring EA and the cover ring CA are placed onto the peripheral upper surface 104b of the ESC 104 and the upper surface 105Aa of the support 105A. More specifically, the cover ring CA is first placed onto the upper surface 105Aa of the support 105A, and then the edge ring EA is placed onto the peripheral upper surface 104*b* of the ESC 104.

The embodiments described herein are illustrative in all aspects and should not be construed to be restrictive. The components in the above embodiments may be eliminated, substituted, or modified in various forms without departing from the spirit and scope of the appended claims. For example, the components in the above embodiments may be combined as appropriate. These combinations produce the same advantageous effects as the respective embodiments in the combinations, as well as other advantageous effects that are apparent to those skilled in the art from the embodiments described herein.

The effects described herein are merely illustrative or exemplary and are not limitative. In other words, the technique according to one or more embodiments of the disclosure may produce other effects that will be apparent to those skilled in the art from the embodiments described herein, in addition to or in place of the above effects.

The example structures described below may also fall within the technical scope of the disclosure.

(1) A substrate processing system, comprising:
a plasma processing apparatus;
a decompression transferrer coupled to the plasma processing apparatus; and
a controller,
wherein the plasma processing apparatus includes
a process chamber being decompressible,
a substrate support in the process chamber, the substrate support including a substrate support surface, a ring support surface on which an edge ring is placeable to surround a substrate, and an electrostatic chuck configured to electrostatically clamp the edge ring onto the ring support surface, the substrate support being coupled to a power source configured to provide a pulsed direct current voltage for biasing,
a lift assembly configured to raise and lower the edge ring, and
a plasma generator configured to generate plasma in the process chamber,
the decompression transferrer includes a transfer robot configured to transfer the edge ring, the controller controls operations including
lowering, with the lift assembly, the edge ring loaded into the process chamber and transferred to the lift assembly by the transfer robot and placing the edge ring onto the ring support surface,
electrostatically clamping, onto the ring support surface, the placed edge ring, and
generating plasma in the process chamber and stabilizing the electrostatically clamping the edge ring onto the electrostatic chuck before performing plasma processing on a product substrate,
the stabilizing includes applying, to the substrate support, the pulsed direct current voltage for biasing, and
the applying the pulsed direct current voltage includes applying a first bias voltage and applying a second bias voltage higher than the first bias voltage after applying the first bias voltage.

(2) A substrate processing system, comprising:
a plasma processing apparatus;
a decompression transferrer coupled to the plasma processing apparatus; and
a controller,
wherein the plasma processing apparatus includes
a process chamber being decompressible,
a substrate support in the process chamber, the substrate support including a substrate support surface, a ring support surface on which an edge ring is placeable to surround a substrate, and an electrostatic chuck configured to electrostatically clamp the edge ring onto the ring support surface, the substrate support being coupled to a power source configured to provide radio frequency power for biasing,
a lift assembly configured to raise and lower the edge ring, and
a plasma generator configured to generate plasma in the process chamber,
the decompression transferrer includes a transfer robot configured to transfer the edge ring,
the controller controls operations including
lowering, with the lift assembly, the edge ring loaded into the process chamber and transferred to the lift assembly by the transfer robot and placing the edge ring onto the ring support surface,
electrostatically clamping, onto the ring support surface, the placed edge ring, and
generating plasma in the process chamber and stabilizing the electrostatically clamping the edge ring onto the electrostatic chuck before performing plasma processing on a product substrate,
the stabilizing includes providing, to the substrate support, the radio frequency power for biasing, and
the providing the radio frequency power for biasing includes providing first bias power and providing second bias power greater than the first bias power after providing the first bias power.

(3) The substrate processing system according to (1), wherein
the controller further controls, after the stabilizing and before performing the plasma processing on the product substrate, seasoning an internal space of the process chamber.

(4) The substrate processing system according to (1) or (3), wherein
the stabilizing is performed with a dummy substrate placed on the substrate support surface of the electrostatic chuck, and the dummy substrate differs from the product substrate.

(5) The substrate processing system according to any one of (1), (3), and (4), wherein
the stabilizing includes generating plasma in the process chamber with no substrate placed on the substrate support surface of the electrostatic chuck, and cleaning the electrostatic chuck.

(6) The substrate processing system according to any one of (1) and (3) to (5), wherein
the applying the pulsed direct current voltage further includes applying a third bias voltage higher than the second bias voltage after applying the second bias voltage.

(7) The substrate processing system according to (6), wherein
the applying the third bias voltage includes intermittently applying the pulsed direct current voltage to the substrate support at the third bias voltage.

(8) The substrate processing system according to any one of (1) and (3) to (7), wherein
the applying the pulsed direct current voltage includes applying a pulsed negative direct current voltage, and
the second bias voltage has a greater absolute value than the first bias voltage.

(9) The substrate processing system according to any one of (1) and (3) to (8), wherein
the controller further performs, before the placing the edge ring, generating plasma in the process chamber with the edge ring separated from the ring support surface by the lift assembly, and removing moisture from the edge ring.

(10) The substrate processing system according to (2), wherein
the controller further controls, after the stabilizing and before performing the plasma processing on the product substrate, seasoning in an internal space of the process chamber.

(11) The substrate processing system according to (2) or (10), wherein
the stabilizing is performed with a dummy substrate placed on the substrate support surface of the electrostatic chuck, and the dummy substrate differs from the product substrate.

(12) The substrate processing system according to any one of (2), (10), and (11), wherein
the stabilizing includes generating plasma in the process chamber with no substrate placed on the substrate support surface of the electrostatic chuck, and cleaning the electrostatic chuck.

(13) The substrate processing system according to any one of (2) and (10) to (12), wherein
the providing the radio frequency power further includes providing third bias power greater than the second bias power after providing the second bias power.

(14) The substrate processing system according to (13), wherein
the providing the third bias voltage includes intermittently providing the radio frequency power to the substrate support as the third bias power.

(15) The substrate processing system according to any one of (2) and (10) to (14), wherein
the controller further performs, before the placing the edge ring, generating plasma in the process chamber with the edge ring separated from the ring support surface by the lift assembly, and removing moisture from the edge ring.

(16) A method for installing an edge ring, comprising:
placing an edge ring onto a ring support surface of an electrostatic chuck in a substrate support located in a process chamber in a plasma processing apparatus;
electrostatically clamping, onto the ring support surface, the placed edge ring; and
generating plasma in the process chamber and stabilizing the electrostatically clamping the edge ring onto the electrostatic chuck with the plasma before performing plasma processing on a product substrate placed on a substrate support surface of the electrostatic chuck,
wherein the stabilizing includes applying, to the substrate support, a pulsed direct current voltage for biasing or providing, to the substrate support, radio frequency power for biasing, and
the applying the pulsed direct current voltage or the providing the radio frequency power includes applying a first bias voltage or providing first bias power, and applying a second bias voltage higher than the first bias voltage or providing second bias power greater than the first bias power after applying the first bias voltage or after providing the first bias power.

REFERENCE SIGNS LIST

1 Plasma processing system
50 Transfer module
70 Transfer robot
80 Controller
100 Chamber
101, 101A Wafer support
102 Upper electrode
104 Electrostatic chuck
104a Central upper surface
104b Peripheral upper surface
108, 108A Lifter
140 Bias unit
170 RF power supply
E, EA Edge ring
W Wafer

The invention claimed is:

1. A substrate processing system, comprising:
a plasma processing apparatus;
a decompression transferrer coupled to the plasma processing apparatus; and
a controller,
wherein the plasma processing apparatus includes
a process chamber being decompressible,
a substrate support in the process chamber, the substrate support including a substrate support surface, a ring support surface on which an edge ring is placeable to surround a substrate, and an electrostatic chuck configured to electrostatically clamp the edge ring onto the ring support surface, the substrate support being coupled to a power source configured to provide a pulsed direct current voltage for biasing,
a lift assembly configured to raise and lower the edge ring, and
a plasma generator configured to generate plasma in the process chamber,
the decompression transferrer includes a transfer robot configured to transfer the edge ring,
the controller controls operations including
lowering, with the lift assembly, the edge ring loaded into the process chamber and transferred to the lift assembly by the transfer robot and placing the edge ring onto the ring support surface,
electrostatically clamping, onto the ring support surface, the placed edge ring, and
generating plasma in the process chamber and stabilizing the electrostatically clamping the edge ring onto the electrostatic chuck before performing plasma processing on a product substrate, the stabilizing includes applying, to the substrate support, the pulsed direct current voltage for biasing, and
the applying the pulsed direct current voltage includes applying a first bias voltage and applying a second bias voltage higher than the first bias voltage after applying the first bias voltage.

2. A substrate processing system, comprising:
a plasma processing apparatus;
a decompression transferrer coupled to the plasma processing apparatus; and
a controller,
wherein the plasma processing apparatus includes
a process chamber being decompressible,
a substrate support in the process chamber, the substrate support including a substrate support surface, a ring support surface on which an edge ring is placeable to surround a substrate, and an electrostatic chuck configured to electrostatically clamp the edge ring onto the ring support surface, the substrate support being coupled to a power source configured to provide radio frequency power for biasing, a lift assembly configured to raise and lower the edge ring, and a plasma generator configured to generate plasma in the process chamber, the decompression transferrer includes a transfer robot configured to transfer the edge ring, the controller controls operations including lowering, with the lift assembly, the edge ring loaded into the process chamber and transferred to the lift assembly by the transfer robot and placing the edge ring onto the ring support surface, electrostatically clamping, onto the ring support surface, the placed edge ring, and generating plasma in the process chamber and stabilizing the electrostatically clamping the edge ring onto the electrostatic chuck before performing plasma processing on a product substrate, the stabilizing includes providing, to the substrate support, the radio frequency power for biasing, and the providing the radio frequency power for biasing includes providing first bias power and providing second bias power greater than the first bias power after providing the first bias power.

3. The substrate processing system according to claim 1, wherein the controller further controls, after the stabilizing and before performing the plasma processing on the product substrate, seasoning an internal space of the process chamber.

4. The substrate processing system according to claim 1, wherein the stabilizing is performed with a dummy substrate placed on the substrate support surface of the electrostatic chuck, and the dummy substrate differs from the product substrate.

5. The substrate processing system according to claim 1, wherein the stabilizing includes generating plasma in the process chamber with no substrate placed on the substrate support surface of the electrostatic chuck, and cleaning the electrostatic chuck.

6. The substrate processing system according to claim 1, wherein the applying the pulsed direct current voltage further includes applying a third bias voltage higher than the second bias voltage after applying the second bias voltage.

7. The substrate processing system according to claim 6, wherein the applying the third bias voltage includes intermittently applying the pulsed direct current voltage to the substrate support at the third bias voltage.

8. The substrate processing system according to claim 1, wherein the applying the pulsed direct current voltage includes applying a pulsed negative direct current voltage, and the second bias voltage has a greater absolute value than the first bias voltage.

9. The substrate processing system according to claim 1, wherein the controller further performs, before the placing the edge ring, generating plasma in the process chamber with the edge ring separated from the ring support surface by the lift assembly, and removing moisture from the edge ring.

10. The substrate processing system according to claim 2, wherein the controller further controls, after the stabilizing and before performing the plasma processing on the product substrate, seasoning in an internal space of the process chamber.

11. The substrate processing system according to claim 2, wherein the stabilizing is performed with a dummy substrate placed on the substrate support surface of the electrostatic chuck, and the dummy substrate differs from the product substrate.

12. The substrate processing system according to claim 2, wherein the stabilizing includes generating plasma in the process chamber with no substrate placed on the substrate support surface of the electrostatic chuck, and cleaning the electrostatic chuck.

13. The substrate processing system according to claim 2, wherein the providing the radio frequency power further includes providing third bias power greater than the second bias power after providing the second bias power.

14. The substrate processing system according to claim 13, wherein the providing the third bias voltage includes intermittently providing the radio frequency power to the substrate support as the third bias power.

15. The substrate processing system according to claim 2, wherein the controller further performs, before the placing the edge ring, generating plasma in the process chamber with the edge ring separated from the ring support surface by the lift assembly, and removing moisture from the edge ring.

16. A method for installing an edge ring, comprising:

placing an edge ring onto a ring support surface of an electrostatic chuck in a substrate support located in a process chamber in a plasma processing apparatus;

electrostatically clamping, onto the ring support surface, the placed edge ring; and generating plasma in the process chamber and stabilizing the electrostatically clamping the edge ring onto the electrostatic chuck with the plasma before performing plasma processing on a product substrate placed on a substrate support surface of the electrostatic chuck, wherein the stabilizing includes applying, to the substrate support, a pulsed direct current voltage for biasing or providing, to the substrate support, radio frequency power for biasing, and the applying the pulsed direct current voltage or the providing the radio frequency power includes applying a first bias voltage or providing first bias power, and applying a second bias voltage higher than the first bias voltage or providing second bias power greater than the first bias power after applying the first bias voltage or after providing the first bias power.

* * * * *